United States Patent
Wright

(10) Patent No.: US 12,181,943 B2
(45) Date of Patent: Dec. 31, 2024

(54) REDUCING SLEEP CURRENT IN A CAPACITANCE SENSING SYSTEM

(71) Applicant: Cypress Semiconductor Corporation, San Jose, CA (US)

(72) Inventor: David G. Wright, San Mateo, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 219 days.

(21) Appl. No.: 16/990,933

(22) Filed: Aug. 11, 2020

(65) Prior Publication Data

US 2021/0026431 A1 Jan. 28, 2021

Related U.S. Application Data

(63) Continuation of application No. 16/130,235, filed on Sep. 13, 2018, now Pat. No. 10,788,937, which is a continuation of application No. 15/407,169, filed on Jan. 16, 2017, now abandoned, which is a continuation of application No. 14/606,767, filed on
(Continued)

(51) Int. Cl.

| | |
|---|---|
| G06F 1/3203 | (2019.01) |
| G06F 1/3234 | (2019.01) |
| G06F 3/0354 | (2013.01) |
| G06F 3/042 | (2006.01) |
| G06F 3/044 | (2006.01) |
| G09G 3/20 | (2006.01) |
| H03K 17/96 | (2006.01) |

(52) U.S. Cl.
CPC .......... *G06F 1/3203* (2013.01); *G06F 1/3262* (2013.01); *G06F 3/03548* (2013.01); *G06F 3/042* (2013.01); *G09G 3/20* (2013.01); *H03K 17/9622* (2013.01); *G06F 3/044* (2013.01); *G06F 2203/04106* (2013.01); *G06F 2203/04108* (2013.01); *G09G 2330/022* (2013.01)

(58) Field of Classification Search
CPC .......... G06F 3/044; G06F 2203/04104; G06F 3/0412; G06F 3/041; G06F 1/26; G06F 1/3262; G06F 1/3203; G06F 1/3206; G06F 1/32; G06F 1/3231
See application file for complete search history.

(56) References Cited

U.S. PATENT DOCUMENTS

| | | | |
|---|---|---|---|
| 3,660,801 | A | 5/1972 | Bernard |
| 3,696,908 | A | 10/1972 | Gluck et al. |

(Continued)

FOREIGN PATENT DOCUMENTS

| | | |
|---|---|---|
| EP | 0574213 A | 12/1993 |
| GB | 05000604 | 2/2005 |
| WO | 0002188 A | 1/2000 |

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

(Continued)

*Primary Examiner* — Michael J Jansen, II

(57) ABSTRACT

An apparatus and method of measuring a collective capacitance on a group of capacitive sense elements from at least one of rows or columns of a capacitance sense array when in a first mode, and individually measuring capacitances on each of the rows and columns when in a second mode.

18 Claims, 11 Drawing Sheets

Related U.S. Application Data

Jan. 27, 2015, now Pat. No. 9,575,606, which is a continuation of application No. 13/049,556, filed on Mar. 16, 2011, now Pat. No. 8,976,124, which is a continuation of application No. 11/801,115, filed on May 7, 2007, now Pat. No. 8,144,126.

(56) References Cited

U.S. PATENT DOCUMENTS

| | | |
|---|---|---|
| 3,750,113 A | 7/1973 | Cencel |
| 3,875,472 A | 4/1975 | Schermerhorn |
| 3,921,167 A | 11/1975 | Fox |
| 3,979,745 A | 9/1976 | Bishop |
| 4,039,940 A | 8/1977 | Butler et al. |
| 4,090,092 A | 5/1978 | Serrano |
| 4,103,252 A | 7/1978 | Bobick |
| 4,113,378 A | 9/1978 | Wirtz |
| 4,157,539 A | 6/1979 | Hunts et al. |
| 4,163,222 A | 7/1979 | Grove |
| 4,175,239 A | 11/1979 | Sandler |
| 4,235,871 A | 11/1980 | Papahadjopoulos et al. |
| 4,264,903 A | 4/1981 | Bigelow |
| 4,266,144 A | 5/1981 | Bristol |
| 4,283,713 A | 8/1981 | Philipp |
| 4,293,734 A | 10/1981 | Pepper |
| 4,305,135 A | 12/1981 | Dahl et al. |
| 4,340,777 A | 7/1982 | DeCosta et al. |
| 4,405,917 A | 9/1983 | Chai |
| 4,405,918 A | 9/1983 | Wall et al. |
| 4,438,404 A | 3/1984 | Philipp |
| 4,475,151 A | 10/1984 | Philipp |
| 4,495,485 A | 1/1985 | Smith |
| 4,497,575 A | 2/1985 | Philipp |
| 4,550,221 A | 10/1985 | Mabusth |
| 4,560,830 A | 12/1985 | Perl |
| 4,727,767 A | 3/1988 | Aiki et al. |
| 4,736,097 A | 4/1988 | Philipp |
| 4,736,191 A | 4/1988 | Matzke et al. |
| 4,737,768 A | 4/1988 | Lewiner et al. |
| 4,742,331 A | 5/1988 | Barrow et al. |
| 4,772,874 A | 9/1988 | Hasegawa |
| 4,772,983 A | 9/1988 | Kerber et al. |
| 4,773,024 A | 9/1988 | Faggin et al. |
| 4,802,103 A | 1/1989 | Faggin et al. |
| 4,876,534 A | 10/1989 | Mead et al. |
| 4,879,461 A | 11/1989 | Philipp |
| 4,879,505 A | 11/1989 | Barrow et al. |
| 4,879,508 A | 11/1989 | Andermo |
| 4,908,574 A | 3/1990 | Rhoades et al. |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,954,823 A | 9/1990 | Binstead |
| 4,962,342 A | 10/1990 | Mead et al. |
| 4,977,480 A | 12/1990 | Nishihara |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,089,757 A | 2/1992 | Wilson |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,274,371 A | 12/1993 | Yang et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,374,787 A | 12/1994 | Miller et al. |
| 5,381,515 A | 1/1995 | Platt et al. |
| 5,384,467 A | 1/1995 | Plimon et al. |
| 5,386,584 A | 1/1995 | Verstegen et al. |
| 5,408,194 A | 4/1995 | Steinbach et al. |
| 5,412,387 A | 5/1995 | Vincelette et al. |
| 5,424,756 A | 6/1995 | Ho et al. |
| 5,463,388 A | 10/1995 | Boie et al. |
| 5,488,204 A | 1/1996 | Mead et al. |
| 5,495,077 A | 2/1996 | Miller et al. |
| 5,499,026 A | 3/1996 | Liao et al. |
| 5,508,700 A | 4/1996 | Taylor et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,629,891 A | 5/1997 | LeMoncheck et al. |
| 5,648,642 A | 7/1997 | Miller et al. |
| 5,670,915 A | 9/1997 | Cooper et al. |
| 5,672,959 A | 9/1997 | Der |
| 5,682,032 A | 10/1997 | Philipp |
| 5,684,487 A | 11/1997 | Timko |
| 5,691,513 A | 11/1997 | Yamamoto et al. |
| 5,694,063 A | 12/1997 | Burlison et al. |
| 5,730,165 A | 3/1998 | Philipp |
| 5,748,185 A | 5/1998 | Stephan et al. |
| 5,757,368 A | 5/1998 | Gerpheide et al. |
| 5,763,909 A | 6/1998 | Mead et al. |
| 5,763,924 A | 6/1998 | Lum et al. |
| 5,767,457 A | 6/1998 | Gerpheide et al. |
| 5,790,107 A | 8/1998 | Kasser et al. |
| 5,796,183 A | 8/1998 | Hourmand |
| 5,812,698 A | 9/1998 | Platt et al. |
| 5,841,078 A | 11/1998 | Miller et al. |
| 5,844,265 A | 12/1998 | Mead et al. |
| 5,844,506 A | 12/1998 | Binstead |
| 5,854,625 A | 12/1998 | Frisch et al. |
| 5,856,822 A | 1/1999 | Du et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,872,561 A | 2/1999 | Figie et al. |
| 5,880,411 A | 3/1999 | Gillespie et al. |
| 5,889,236 A | 3/1999 | Gillespie et al. |
| 5,905,489 A | 5/1999 | Takahama et al. |
| 5,914,465 A | 6/1999 | Allen et al. |
| 5,914,708 A | 6/1999 | LaGrange et al. |
| 5,920,309 A * | 7/1999 | Bisset .................. G06F 3/0441 345/173 |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,949,264 A | 9/1999 | Lo |
| 5,969,513 A | 10/1999 | Clark |
| 6,023,422 A | 2/2000 | Allen et al. |

(56) References Cited

U.S. PATENT DOCUMENTS

| | | | |
|---|---|---|---|
| 6,025,726 A | 2/2000 | Gershenfeld et al. |
| 6,028,271 A | 2/2000 | Gillespie et al. |
| 6,028,959 A | 2/2000 | Wang et al. |
| 6,037,929 A | 3/2000 | Ogura et al. |
| 6,067,019 A | 5/2000 | Scott |
| 6,097,432 A | 8/2000 | Mead et al. |
| 6,140,853 A | 10/2000 | Lo |
| 6,148,104 A | 11/2000 | Wang et al. |
| 6,185,450 B1 | 2/2001 | Seguine et al. |
| 6,188,228 B1 | 2/2001 | Philipp |
| 6,188,391 B1 | 2/2001 | Seely et al. |
| 6,222,528 B1* | 4/2001 | Gerpheide ............ G06F 3/0446 345/173 |
| 6,239,389 B1 | 5/2001 | Allen et al. |
| 6,249,447 B1 | 6/2001 | Boylan et al. |
| 6,262,717 B1 | 7/2001 | Donohue et al. |
| 6,269,449 B1 | 7/2001 | Kocis |
| 6,271,719 B1 | 8/2001 | Sevastopoulos |
| 6,271,720 B1 | 8/2001 | Sevastopoulos |
| 6,278,283 B1 | 8/2001 | Tsugai |
| 6,280,391 B1 | 8/2001 | Olson et al. |
| 6,288,707 B1 | 9/2001 | Philipp |
| 6,300,305 B1 | 10/2001 | Huff et al. |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,377,009 B1 | 4/2002 | Philipp |
| 6,380,929 B1 | 4/2002 | Platt |
| 6,380,931 B1 | 4/2002 | Gillespie et al. |
| 6,400,217 B1 | 6/2002 | Bhandari |
| 6,414,671 B1 | 7/2002 | Gillespie et al. |
| 6,424,338 B1 | 7/2002 | Anderson |
| 6,429,857 B1 | 8/2002 | Masters et al. |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,452,514 B1 | 9/2002 | Philipp |
| 6,457,355 B1 | 10/2002 | Philipp |
| 6,459,321 B1 | 10/2002 | Belch |
| 6,459,424 B1 | 10/2002 | Resman |
| 6,466,036 B1 | 10/2002 | Philipp |
| 6,473,069 B1 | 10/2002 | Gerpheide |
| 6,489,899 B1 | 12/2002 | Ely et al. |
| 6,498,720 B2 | 12/2002 | Glad |
| 6,499,359 B1 | 12/2002 | Washeleski et al. |
| 6,504,530 B1 | 1/2003 | Wilson et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,529,015 B2 | 3/2003 | Nonoyama et al. |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,704,005 B2 | 3/2004 | Kato et al. |
| 6,705,511 B1 | 3/2004 | Dames et al. |
| 6,714,817 B2 | 3/2004 | Daynes et al. |
| 6,720,777 B2 | 4/2004 | Wang |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,768,420 B2 | 7/2004 | McCarthy et al. |
| 6,788,221 B1 | 9/2004 | Ely et al. |
| 6,788,521 B2 | 9/2004 | Nishi |
| 6,798,218 B2 | 9/2004 | Kasperkovitz |
| 6,803,905 B1 | 10/2004 | Capps et al. |
| 6,809,275 B1 | 10/2004 | Cheng et al. |
| 6,825,890 B2 | 11/2004 | Matsufusa |
| 6,839,052 B1 | 1/2005 | Kramer |
| 6,856,433 B2 | 2/2005 | Hatano et al. |
| 6,861,961 B2 | 3/2005 | Sandbach et al. |
| 6,873,203 B1 | 3/2005 | Paul et al. |
| 6,879,215 B1 | 4/2005 | Roach |
| 6,879,930 B2* | 4/2005 | Sinclair ............... G06F 3/03547 702/150 |
| 6,888,536 B2 | 5/2005 | Westerman et al. |
| 6,888,538 B2 | 5/2005 | Ely et al. |
| 6,893,724 B2 | 5/2005 | Lin et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,947,031 B2 | 9/2005 | Sandbach et al. |
| 6,949,811 B2 | 9/2005 | Miyazawa |
| 6,949,937 B2 | 9/2005 | Knoedgen |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | O'Dowd et al. |
| 6,975,123 B1 | 12/2005 | Malang et al. |
| 6,993,607 B2 | 1/2006 | Philipp |
| 7,006,078 B2 | 2/2006 | Kim |
| 7,006,938 B2 | 2/2006 | Laraia et al. |
| 7,030,782 B2 | 4/2006 | Ely et al. |
| 7,030,860 B1 | 4/2006 | Hsu et al. |
| 7,032,051 B2 | 4/2006 | Reay et al. |
| 7,036,096 B1 | 4/2006 | Sarkar et al. |
| 7,046,230 B2 | 5/2006 | Zadesky et al. |
| 7,050,927 B2* | 5/2006 | Sinclair ................. G06F 3/0362 702/150 |
| 7,075,316 B2 | 7/2006 | Umeda et al. |
| 7,075,523 B2 | 7/2006 | Marten et al. |
| 7,075,864 B2 | 7/2006 | Kakitsuka et al. |
| 7,084,645 B1 | 8/2006 | Umeda et al. |
| 7,109,978 B2 | 9/2006 | Gillespie et al. |
| 7,119,550 B2 | 10/2006 | Kitano et al. |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,176,907 B2* | 2/2007 | Chao ..................... G06F 3/046 178/18.07 |
| 7,202,655 B2 | 4/2007 | Itoh |
| 7,202,855 B2 | 4/2007 | Shigetaka et al. |
| 7,202,859 B1 | 4/2007 | Speck et al. |
| 7,205,777 B2 | 4/2007 | Schulz et al. |
| 7,212,189 B2 | 5/2007 | Shaw et al. |
| 7,224,591 B2 | 5/2007 | Kaishita et al. |
| 7,233,508 B2 | 6/2007 | Itoh |
| 7,245,131 B2 | 7/2007 | Kurachi et al. |
| 7,253,643 B1 | 8/2007 | Seguine |
| 7,288,946 B2 | 10/2007 | Hargreaves et al. |
| 7,288,977 B2 | 10/2007 | Stanley |
| 7,298,124 B2 | 11/2007 | Kan et al. |
| 7,301,350 B2 | 11/2007 | Hargreaves et al. |
| 7,301,351 B2 | 11/2007 | Deangelis et al. |
| 7,307,485 B1 | 12/2007 | Snyder et al. |
| 7,312,616 B2 | 12/2007 | Snyder |

(56) References Cited

U.S. PATENT DOCUMENTS

| | | | |
|---|---|---|---|
| 7,323,886 B2 | 1/2008 | Lee | |
| 7,327,352 B2 | 2/2008 | Keefer et al. | |
| 7,333,090 B2 | 2/2008 | Tanaka et al. | |
| 7,362,244 B2 | 4/2008 | Sun | |
| 7,362,313 B2 | 4/2008 | Geaghan et al. | |
| 7,439,962 B2 | 10/2008 | Reynolds et al. | |
| 7,446,300 B2 | 11/2008 | Silvestre | |
| 7,449,895 B2 | 11/2008 | Ely et al. | |
| 7,450,113 B2 | 11/2008 | Gillespie et al. | |
| 7,453,444 B2 | 11/2008 | Geaghan | |
| 7,466,307 B2 | 12/2008 | Trent, Jr. et al. | |
| 7,479,949 B2 | 1/2009 | Jobs et al. | |
| 7,499,040 B2 | 3/2009 | Zadesky et al. | |
| 7,532,205 B2 | 5/2009 | Gillespie et al. | |
| 7,539,513 B2 | 5/2009 | Cathey et al. | |
| RE40,867 E | 8/2009 | Binstead | |
| 7,570,290 B2 | 8/2009 | Yokota et al. | |
| 7,580,030 B2 | 8/2009 | Marten | |
| 7,598,752 B2 | 10/2009 | Li | |
| 7,609,253 B2 | 10/2009 | Trent et al. | |
| 7,635,828 B2 | 12/2009 | Finley et al. | |
| 7,643,011 B2 | 1/2010 | Westerman | |
| 7,656,168 B2 | 2/2010 | Mahowald et al. | |
| 7,663,607 B2 | 2/2010 | Hotelling et al. | |
| 7,667,468 B1 | 2/2010 | Anderson | |
| 7,685,828 B2 | 3/2010 | Foucault et al. | |
| 7,730,401 B2 | 6/2010 | Gillespie et al. | |
| 7,812,825 B2 | 10/2010 | Sinclair et al. | |
| 7,812,827 B2 | 10/2010 | Hotelling et al. | |
| 7,825,905 B2 | 11/2010 | Philipp | |
| 7,831,070 B1 | 11/2010 | Cheng et al. | |
| 7,855,718 B2 * | 12/2010 | Westerman | G06F 3/04182 345/173 |
| 7,868,874 B2 | 1/2011 | Reynolds | |
| 7,932,897 B2 | 4/2011 | Elias et al. | |
| 8,040,325 B2 | 10/2011 | Lee et al. | |
| 8,049,732 B2 | 11/2011 | Hotelling et al. | |
| 8,059,015 B2 | 11/2011 | Hua et al. | |
| 8,067,948 B2 | 11/2011 | Sequine | |
| 8,068,097 B2 | 11/2011 | GuangHai | |
| 8,082,566 B2 | 12/2011 | Stallings | |
| 8,089,289 B1 | 1/2012 | Kremin et al. | |
| 8,093,914 B2 | 1/2012 | Maharyta et al. | |
| 8,094,128 B2 * | 1/2012 | Vu | G06F 3/0446 345/173 |
| 8,111,243 B2 | 2/2012 | Peng et al. | |
| 8,125,456 B2 * | 2/2012 | Krah | G06F 1/3203 345/173 |
| 8,144,125 B2 | 3/2012 | Peng et al. | |
| 8,144,126 B2 | 3/2012 | Wright | |
| 8,169,238 B1 | 5/2012 | Maharyta et al. | |
| 8,279,180 B2 | 10/2012 | Hotelling et al. | |
| 8,284,165 B2 | 10/2012 | Koshiyama et al. | |
| 8,358,142 B2 | 1/2013 | Maharyta | |
| 8,400,406 B1 | 3/2013 | Kurtz et al. | |
| 8,462,135 B1 | 6/2013 | Xiao et al. | |
| 8,537,121 B2 | 9/2013 | XiaoPing | |
| 8,542,211 B2 | 9/2013 | Elias | |
| 8,552,998 B2 | 10/2013 | Hotelling et al. | |
| 8,816,984 B2 | 8/2014 | Hotelling et al. | |
| 8,902,172 B2 | 12/2014 | Peng et al. | |
| 8,928,617 B2 | 1/2015 | Hotelling et al. | |
| 8,976,124 B1 | 3/2015 | Wright | |
| 9,575,606 B1 | 2/2017 | Wright | |
| 2002/0063688 A1 | 5/2002 | Shaw et al. | |
| 2002/0067348 A1 | 6/2002 | Masters et al. | |
| 2002/0080014 A1 | 6/2002 | Mccarthy et al. | |
| 2002/0185981 A1 | 12/2002 | Dietz et al. | |
| 2002/0191029 A1 | 12/2002 | Gillespie et al. | |
| 2003/0025679 A1 | 2/2003 | Taylor et al. | |
| 2003/0028346 A1 * | 2/2003 | Sinclair | G06F 3/0445 702/150 |
| 2003/0058053 A1 | 3/2003 | Jeon et al. | |
| 2003/0062889 A1 | 4/2003 | Ely et al. | |
| 2003/0063073 A1 | 4/2003 | Geaghan et al. | |
| 2003/0063428 A1 | 4/2003 | Nishi | |
| 2003/0064326 A1 | 4/2003 | Yamamoto et al. | |
| 2003/0076306 A1 | 4/2003 | Zadesky et al. | |
| 2003/0080755 A1 | 5/2003 | Kobayashi | |
| 2003/0098858 A1 | 5/2003 | Perski et al. | |
| 2003/0112021 A1 | 6/2003 | Palata et al. | |
| 2003/0156098 A1 | 8/2003 | Shaw et al. | |
| 2003/0160808 A1 | 8/2003 | Foote et al. | |
| 2003/0183864 A1 | 10/2003 | Miyazawa | |
| 2003/0183884 A1 | 10/2003 | Miyazawa | |
| 2003/0184315 A1 | 10/2003 | Eberlein | |
| 2003/0189419 A1 | 10/2003 | Maki et al. | |
| 2003/0217871 A1 * | 11/2003 | Chao | G06F 3/046 178/18.01 |
| 2003/0230438 A1 | 12/2003 | Keefer et al. | |
| 2004/0017355 A1 | 1/2004 | Shim | |
| 2004/0024341 A1 | 2/2004 | Jacobs | |
| 2004/0056845 A1 | 3/2004 | Harkcom et al. | |
| 2004/0169594 A1 | 9/2004 | Ely et al. | |
| 2004/0178989 A1 | 9/2004 | Shahoian et al. | |
| 2004/0178997 A1 | 9/2004 | Gillespie et al. | |
| 2004/0183560 A1 | 9/2004 | Savage et al. | |
| 2004/0209591 A1 | 10/2004 | Martin et al. | |
| 2004/0239650 A1 | 12/2004 | Mackey | |
| 2004/0252109 A1 | 12/2004 | Trent et al. | |
| 2004/0263864 A1 | 12/2004 | Lukacs et al. | |
| 2005/0021269 A1 | 1/2005 | Ely et al. | |
| 2005/0023145 A1 | 2/2005 | Cohen et al. | |
| 2005/0024341 A1 | 2/2005 | Gillespie et al. | |
| 2005/0035956 A1 | 2/2005 | Sinclair et al. | |
| 2005/0052429 A1 | 3/2005 | Philipp | |
| 2005/0062732 A1 * | 3/2005 | Sinclair | G06F 3/0362 345/184 |
| 2005/0073302 A1 | 4/2005 | Hibbs et al. | |
| 2005/0073322 A1 | 4/2005 | Hibbs et al. | |
| 2005/0083110 A1 | 4/2005 | Latham et al. | |
| 2005/0099188 A1 | 5/2005 | Baxter | |
| 2005/0231487 A1 | 10/2005 | Ming | |
| 2005/0270273 A1 | 12/2005 | Marten | |
| 2005/0283330 A1 | 12/2005 | Laraia et al. | |
| 2006/0007023 A1 | 1/2006 | Wright et al. | |
| 2006/0012575 A1 | 1/2006 | Knapp et al. | |
| 2006/0017701 A1 | 1/2006 | Marten et al. | |
| 2006/0026521 A1 | 2/2006 | Hotelling et al. | |
| 2006/0026536 A1 | 2/2006 | Hotelling et al. | |
| 2006/0032680 A1 | 2/2006 | Elias et al. | |
| 2006/0066582 A1 | 3/2006 | Lyon et al. | |
| 2006/0097991 A1 | 5/2006 | Hotelling et al. | |
| 2006/0113974 A1 | 6/2006 | Kan et al. | |
| 2006/0139340 A1 | 6/2006 | Geaghan | |
| 2006/0139469 A1 | 6/2006 | Yokota et al. | |
| 2006/0158202 A1 | 7/2006 | Umeda et al. | |
| 2006/0164142 A1 | 7/2006 | Stanley | |
| 2006/0176718 A1 | 8/2006 | Itoh | |
| 2006/0187214 A1 | 8/2006 | Gillespie et al. | |
| 2006/0192690 A1 | 8/2006 | Philipp | |
| 2006/0197752 A1 | 9/2006 | Hurst et al. | |
| 2006/0197753 A1 | 9/2006 | Hotelling | |
| 2006/0238518 A1 | 10/2006 | Westerman et al. | |
| 2006/0267953 A1 | 11/2006 | Peterson et al. | |
| 2006/0273804 A1 | 12/2006 | Delorme et al. | |
| 2006/0274042 A1 | 12/2006 | Krah et al. | |
| 2007/0008299 A1 | 1/2007 | Hristov | |
| 2007/0032680 A1 | 2/2007 | Felder et al. | |
| 2007/0046651 A1 | 3/2007 | Sinclair et al. | |
| 2007/0063876 A1 | 3/2007 | Wong | |
| 2007/0074913 A1 | 4/2007 | Geaghan et al. | |
| 2007/0079996 A1 | 4/2007 | Lee et al. | |
| 2007/0100566 A1 | 5/2007 | Coley | |
| 2007/0109274 A1 | 5/2007 | Reynolds | |
| 2007/0132737 A1 | 6/2007 | Mulligan et al. | |
| 2007/0152977 A1 | 7/2007 | Ng et al. | |
| 2007/0164756 A1 | 7/2007 | Lee | |
| 2007/0173220 A1 | 7/2007 | Kim et al. | |
| 2007/0177803 A1 | 8/2007 | Elias et al. | |
| 2007/0228256 A1 | 10/2007 | Mentzer et al. | |
| 2007/0229466 A1 | 10/2007 | Peng et al. | |
| 2007/0229468 A1 | 10/2007 | Peng et al. | |
| 2007/0229469 A1 | 10/2007 | Seguine | |

(56) References Cited

U.S. PATENT DOCUMENTS

| | | |
|---|---|---|
| 2007/0229470 A1 | 10/2007 | Snyder et al. |
| 2007/0236475 A1 | 10/2007 | Wherry |
| 2007/0236478 A1* | 10/2007 | Geaghan ............... G06F 3/0416 345/173 |
| 2007/0236618 A1 | 10/2007 | Maag et al. |
| 2007/0247431 A1 | 10/2007 | Skillman et al. |
| 2007/0257890 A1 | 11/2007 | Hotelling et al. |
| 2007/0262962 A1 | 11/2007 | XiaoPing et al. |
| 2007/0268243 A1 | 11/2007 | Choo et al. |
| 2007/0268272 A1 | 11/2007 | Perski et al. |
| 2007/0273560 A1 | 11/2007 | Hua et al. |
| 2007/0273660 A1 | 11/2007 | Xiaoping |
| 2008/0007434 A1 | 1/2008 | Hristov |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0041640 A1 | 2/2008 | Gillespie et al. |
| 2008/0042994 A1 | 2/2008 | Gillespie et al. |
| 2008/0048997 A1 | 2/2008 | Gillespie et al. |
| 2008/0062140 A1 | 3/2008 | Hotelling et al. |
| 2008/0062148 A1 | 3/2008 | Hotelling et al. |
| 2008/0084400 A1 | 4/2008 | Rosenberg |
| 2008/0088595 A1 | 4/2008 | Liu et al. |
| 2008/0088602 A1 | 4/2008 | Hotelling |
| 2008/0111714 A1 | 5/2008 | Kremin |
| 2008/0122796 A1 | 5/2008 | Jobs et al. |
| 2008/0122798 A1 | 5/2008 | Koshiyama et al. |
| 2008/0136792 A1 | 6/2008 | Peng et al. |
| 2008/0150906 A1 | 6/2008 | Grivna |
| 2008/0158145 A1* | 7/2008 | Westerman ......... G06K 9/00375 345/156 |
| 2008/0158167 A1 | 7/2008 | Hotelling et al. |
| 2008/0158169 A1 | 7/2008 | Westerman |
| 2008/0158177 A1 | 7/2008 | Wilson et al. |
| 2008/0158178 A1 | 7/2008 | Hotelling et al. |
| 2008/0158183 A1 | 7/2008 | Hotelling et al. |
| 2008/0158184 A1 | 7/2008 | Land et al. |
| 2008/0162996 A1* | 7/2008 | Krah ...................... G06F 3/0418 714/27 |
| 2008/0162997 A1* | 7/2008 | Vu ......................... G06F 3/0445 714/27 |
| 2008/0165132 A1 | 7/2008 | Weiss |
| 2008/0165140 A1 | 7/2008 | Christie et al. |
| 2008/0165141 A1 | 7/2008 | Christie |
| 2008/0165255 A1 | 7/2008 | Christie et al. |
| 2008/0179112 A1 | 7/2008 | Qin et al. |
| 2008/0180399 A1 | 7/2008 | Cheng |
| 2008/0192005 A1 | 8/2008 | Elgoyhen et al. |
| 2008/0196945 A1 | 8/2008 | Konstas |
| 2008/0204426 A1 | 8/2008 | Hotelling et al. |
| 2008/0246723 A1 | 10/2008 | Baumbach |
| 2008/0250864 A1 | 10/2008 | Shipton |
| 2008/0277171 A1 | 11/2008 | Wright |
| 2008/0278178 A1 | 11/2008 | Philipp |
| 2008/0309623 A1 | 12/2008 | Hotelling et al. |
| 2008/0309634 A1 | 12/2008 | Hotelling et al. |
| 2008/0316183 A1 | 12/2008 | Westerman et al. |
| 2009/0085894 A1 | 4/2009 | Gandhi et al. |
| 2009/0096757 A1 | 4/2009 | Hotelling et al. |
| 2009/0096758 A1 | 4/2009 | Hotelling et al. |
| 2009/0128516 A1 | 5/2009 | Rimon et al. |
| 2009/0160787 A1 | 6/2009 | Westerman et al. |
| 2009/0179838 A1 | 7/2009 | Yamashita et al. |
| 2009/0284478 A1 | 11/2009 | De La et al. |
| 2009/0289902 A1 | 11/2009 | Carlvik et al. |
| 2009/0309851 A1 | 12/2009 | Bernstein |
| 2009/0315850 A1 | 12/2009 | Hotelling et al. |
| 2009/0315851 A1 | 12/2009 | Hotelling et al. |
| 2009/0322351 A1 | 12/2009 | McLeod |
| 2010/0007631 A1 | 1/2010 | Chang |
| 2010/0033423 A1 | 2/2010 | Iio |
| 2010/0039405 A1 | 2/2010 | Chen et al. |
| 2010/0073301 A1 | 3/2010 | Yousefpor et al. |
| 2010/0097328 A1 | 4/2010 | Simmons et al. |
| 2010/0302198 A1 | 12/2010 | Tasher et al. |
| 2010/0328262 A1 | 12/2010 | Huang et al. |
| 2010/0328265 A1 | 12/2010 | Hotelling et al. |
| 2011/0025629 A1 | 2/2011 | Grivna et al. |
| 2011/0156724 A1 | 6/2011 | Bokma et al. |
| 2011/0234523 A1 | 9/2011 | Chang et al. |
| 2011/0267310 A1 | 11/2011 | Tsukahara et al. |
| 2012/0043973 A1 | 2/2012 | Kremin |
| 2012/0043976 A1 | 2/2012 | Bokma et al. |
| 2012/0154324 A1 | 6/2012 | Wright et al. |
| 2012/0319996 A1 | 12/2012 | Hotelling et al. |
| 2013/0049771 A1 | 2/2013 | Peng et al. |
| 2013/0100071 A1 | 4/2013 | Wright et al. |
| 2014/0168143 A1 | 6/2014 | Hotelling et al. |
| 2014/0362048 A1 | 12/2014 | Hotelling et al. |
| 2014/0375612 A1 | 12/2014 | Hotelling et al. |

OTHER PUBLICATIONS

"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.

Baxter, Larry K., "Capacitive Sensors, Design and Applications," IEEE Press, The Institute of Electrical and Electronics Engineers, Inc., Aug. 20, 1996, pp. 177-187.

Chapweske, Adam; "The PS/2 Mouse Interface," PS/2 Mouse Interfacing, 2001, retrieved on May 18, 2006; 10 pages.

CSD User Module Data Sheet, Cypress Semiconductor Corporation CSD v 1.0, Oct. 23, 2006; 58 pages.

CSR User Module Data Sheet, SCR v1.0, CY8C21x34 Data Sheet, Oct. 6, 2006, 36 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes sm017," Jan. 24, 2007; 3 pages.

Dennis Seguine, "Capacitive Switch Scan," Cypress Application Note AN2233a, Revision B, Apr. 14, 2005; 6 pages.

Lee, Mark; "EMC Design Considerations for PSoC CapSense Applications," Cypress Semiconductor Corporation, Application Note AN2318; Sep. 16, 2005; 6 pages.

Mark Lee, "CapSense Best Practice", Cypress Application Note AN2394, Rev. \*\*, Oct. 19, 2006, pp. 1-10.

Ryan Seguine et al., "Layout Guidelines for PSoC CapSense", Cypress Application Note AN2292, Revision B, Oct. 31, 2005, pp. 1-15.

Ryan Seguine, "Capacitive Front Panel Display Demonstration" Cypress Semiconductor Application Note, AN2277, Oct. 20, 2005, 7 pages.

Sedra, Adel S. et al., "Microelectronic Circuits," 3rd Edition, Oxford University Press, pp. xiii-xx and 861-883, 1991; 20 pages.

USPTO Advisory Action for U.S. Appl. No. 15/407,169 dated Feb. 2, 2018; 4 pages.

USPTO Final Rejection for U.S. Appl. No. 13/049,556 dated Jun. 13, 2014; 29 pages.

USPTO Final Rejection for U.S. Appl. No. 14/606,767 dated May 12, 2016; 27 pages.

USPTO Final Rejection for U.S. Appl. No. 15/407,169 dated Jun. 15, 2018; 12 pages.

USPTO Final Rejection for U.S. Appl. No. 15/407,169 dated Aug. 9, 2017; 10 pages.

(56) References Cited

OTHER PUBLICATIONS

USPTO Final Rejection for U.S. Appl. No. 16/130,235 dated on Jan. 29, 2020; 16 pages.
USPTO Non Final Rejection for U.S. Appl. No. 13/049,556 dated Jun. 13, 2013; 11 pages.
USPTO Non Final Rejection for U.S. Appl. No. 16/130,235 dated on Sep. 24, 2019; 12 pages.
USPTO Non-Final Rejection for U.S. Appl. No. 13/049,556 dated Jan. 25, 2013; 11 pages.
USPTO Non-Final Rejection for U.S. Appl. No. 13/049,556 dated Feb. 7, 2014; 26 pages.
USPTO Non-Final Rejection for U.S. Appl. No. 13/049,556 dated Oct. 18, 2013; 10 pages.
USPTO Non-Final Rejection for U.S. Appl. No. 14/606,767 dated Dec. 14, 2015; 20 pages.
USPTO Non-Final Rejection for U.S. Appl. No. 15/407,169 dated May 8, 2017; 11 pages.
USPTO Non-Final Rejection for U.S. Appl. No. 15/407,169 dated Apr. 2, 2018; 16 pages.
USPTO Notice of Allowance for U.S. Appl. No. 11/801,115 dated Feb. 2, 2012; 10 pages.
USPTO Notice of Allowance for U.S. Appl. No. 11/801,115 dated Aug. 4, 2011; 5 pages.
USPTO Notice of Allowance for U.S. Appl. No. 11/801,115 dated Aug. 19, 2010; 10 pages.
USPTO Notice of Allowance for U.S. Appl. No. 11/801,115 dated Nov. 30, 2011; 5 pages.
USPTO Notice of Allowance for U.S. Appl. No. 11/801,115 dated Dec. 10, 2010; 10 pages.
USPTO Notice of Allowance for U.S. Appl. No. 13/049,556 dated Sep. 9, 2014; 12 pages.
USPTO Notice of Allowance for U.S. Appl. No. 13/049,556 dated Nov. 7, 2014; 12 pages.
USPTO Notice of Allowance for U.S. Appl. No. 14/606,767 dated Oct. 7, 2016; 13 pages.
USPTO Notice of Allowance for U.S. Appl. No. 16/130,235 dated on Jul. 1, 2020; 9 pages.
Van Ess, D., "Understanding Switched Capacitor Analog Blocs," AN2041, Application Note, Mar. 30, 2004, 16 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.
Wikipedia, The Free Encyclopedia "IBM PC Keyboard" http://en.wikipedia.or/wiki/PC_keyboard>accessed May 19, 2006; 3 pages.

\* cited by examiner

|           | Column 0 | Column 1 | Column 2 | Column 3 | Result 0 | Result 1 | Result 2 | Result 3 |
|-----------|----------|----------|----------|----------|----------|----------|----------|----------|
| Row 0     |          |          |          |          | 1        | 1        | 1        | 1        |
| Row 1     |          |          |          |          | 1        | 1        | 1        | 1        |
| Row 2     |          |          |          |          | 1        | 1        | 1        | 1        |
| Row 3     |          |          |          |          | 1        | 1        | 1        | 1        |
| Pattern 0 | 0        | 1        | 1        | 1        |          |          |          |          |
| Pattern 1 | 1        | 0        | 1        | 1        |          |          |          |          |
| Pattern 2 | 1        | 1        | 0        | 1        |          |          |          |          |
| Pattern 3 | 1        | 1        | 1        | 0        |          |          |          |          |

← 109, ↑ 110

Scan Results for no Button Press

FIG. 1C
Prior Art

|           | Column 0 | Column 1 | Column 2 | Column 3 | Result 0 | Result 1 | Result 2 | Result 3 |
|-----------|----------|----------|----------|----------|----------|----------|----------|----------|
| Row 0     |          |          |          |          | 1        | 1        | 1        | 1        |
| Row 1     |          | ●        |          |          | 1        | 0        | 1        | 1        |
| Row 2     |          |          |          |          | 1        | 1        | 1        | 1        |
| Row 3     |          |          |          |          | 1        | 1        | 1        | 1        |
| Pattern 0 | 0        | 1        | 1        | 1        |          |          |          |          |
| Pattern 1 | 1        | 0        | 1        | 1        |          |          |          |          |
| Pattern 2 | 1        | 1        | 0        | 1        |          |          |          |          |
| Pattern 3 | 1        | 1        | 1        | 0        |          |          |          |          |

111, ← 112, ↑ 113

Scan Results for Button (1,1) Pressed

FIG. 1D
Prior Art

REDUCING SLEEP CURRENT IN A CAPACITANCE SENSING SYSTEM

RELATED APPLICATIONS

This application is a continuation of U.S. patent application Ser. No. 16/130,235, filed on Sep. 13, 2018, which is a Continuation of U.S. application Ser. No. 15/407,169, filed Jan. 16, 2017, which is continuation of U.S. patent application Ser. No. 14/606,767, filed Jan. 27, 2015, now U.S. Pat. No. 9,575,606, issued on Feb. 21, 2017, which is a continuation of U.S. patent application Ser. No. 13/049,556, filed Mar. 16, 2011, now U.S. Pat. No. 8,976,124, issued on Mar. 10, 2015, which is a continuation of U.S. patent application Ser. No. 11/801,115, filed on May 7, 2007, now U.S. Pat. No. 8,144,126, issued on Mar. 27, 2012, all of which are incorporated herein by reference.

TECHNICAL FIELD

This invention relates to the field of user interface devices and, in particular, to touch-sensor devices.

BACKGROUND

Computing devices, such as notebook computers, personal data assistants (PDAs), kiosks, and mobile handsets, have user interface devices, which are also known as human interface devices (HID). One such user interface device is a remote control having multiple buttons for controlling a separate device, such as a television (TV), video cassette recorder (VCR), digital video recorder (DVR), digital video disc (DVD) player receiver, computer, radio, lights, fans, industrial equipment, or the like. Conventional remote controls, however, are limited to having mechanical buttons.

Capacitance sensing is used in wide variety of user interface applications. Examples include touchpads on notebook computers, touchscreens, slider controls used for menu navigation in cellular phones, personal music players, and other hand held electronic devices. One type of capacitance touch-sensor device operates by way of capacitance sensing utilizing capacitive sensors. The capacitance detected by a capacitive sensor changes as a function of the proximity of a conductive object to the sensor. The conductive object can be, for example, a stylus or a user's finger. The touch-sensor devices may include single sensor elements or elements arranged in multiple dimensions for detecting a presence of the conductive object on the touch-sensor device. Regardless of the method, usually an electrical signal representative of the capacitance detected by each capacitive sensor is processed by a processing device, which in turn produces electrical or optical signals representative of activation, position, or the like of the conductive object in relation to the touch-sensor device, such as a touch-sensor pad. A touch-sensor strip, slider, or button operates on the same capacitance-sensing principle.

Capacitance sensing has been implemented in a wide variety of electronic devices to replace mechanical buttons in the electronic devices. Capacitance sensing has many advantages over conventional cursor control devices, mechanical switches, and rotary encoders. A principal such advantage is the lack of moving parts, which allows capacitance sensing to provide great improvements in reliability since there are no moving parts to wear out.

Typically, a capacitance sensing system detects changes in capacitance between a sensing element and electrical ground. For example, in a cap sense button, when the users' finger is in close proximity to the sensor element, a capacitance is formed between the sensor element and the finger—and as the finger is effectively at a ground potential, a detectable capacitance to ground is present when the user's finger is close to the sensor element. In a touchpad or slider, the position of the user's finger is detected by measuring the difference in capacitance to ground between a number of sensing elements arranged as an array.

One disadvantage of capacitance sensing systems is that the capacitance sensing systems sometimes consume more power in the "sleep" mode than do their mechanical equivalents. For example, consider a remote control such as a typical audio-visual remote control used to control a TV, VCR, DVD, etc. Typically, such a device may have 40 buttons, including the digits 0-9, volume up/down, channel up/down, etc. In a conventional button implementation, the mechanical switches would be arranged as an array of eight by five (8×5) buttons, with "scan" and "sense" rows and columns of switches. When no button is pressed, the remote control is in the lowest possible power-consumption state in order to maximize battery life. In this state, typically all the row connections are connected via a resistor to a high voltage and all the column connections are connected to ground. When a button is pressed, one or more of the row connections are pulled to ground through the switch, causing current to flow through the resistor(s). This then wakes up the controller IC which begins scanning the rows and columns to determine which button has been pressed. However, when no button is pressed, there is no current flow at all.

FIG. 1A illustrates a block diagram of a conventional remote control 100 having multiple buttons. The multiple buttons are implemented using a key matrix 102. The key matrix 102, as described in more detail with respect to FIGS. 1B, 1C, and 1D, is coupled to a microcontroller unit (MCU) 101. The MCU 101 is coupled to power circuitry that may include a power source, such as one or more batteries, a power transistor, and a diode. The MCU 101 may be an embedded controller that performs a variety of tasks, all of which help to cut down on the overall system overhead. The MCU 101 may monitor the buttons and report to the main computer whenever a button is pressed or released.

FIG. 1B illustrates a conventional key matrix 102 of FIG. 1. The conventional key matrix 102 includes multiple rows (X0-X2) 101(0)-101(2), and multiple columns (Y0-Y2) 102(0)-102(2). All the rows 101(0)-101(2) are each connected to a pull-up resistor (e.g., 103(0)-103(2)), and all the columns 102(0)-102(2) are each connected to a pull-down transistor (e.g., 104(0)-104(2)), such as an N-Channel MOSFET. Above the key matrix 102 there are multiple buttons 105(0)-105(8). Upon pressing a button, the corresponding row and column (X, Y) are shorted together. For example, the row X will read "0," otherwise the row X is "1." Each button sits over two isolated contacts of its corresponding row and column in the scan matrix. When a button is pressed, the two contacts are shorted together, and the row and column of the button are electrically connected.

FIG. 1C illustrates scan results for no buttons pressed on a conventional key matrix. The controller writes a scan pattern 109 out to the column lines consisting of all "1"s and one "0" which is shifted through each column. In FIG. 1C no buttons are pressed, resulting in all "1"s in the scan results 110 being read at the row lines. FIG. 1D illustrates scan results for a button 111 pressed on a conventional key matrix. The controller writes a scan pattern 112 out to the column lines consisting of all "1"s and one "0" which is shifted through each column. The scan results 113 are then read at the row lines. If a "0" is propagated to a row line, then the button 111 at the intersection of that column and row has been pressed.

However, in a typical capacitance sensing implementation of the same remote control, the controller must wake periodically (e.g., typically every 100 milliseconds (ms)) and measure the capacitance on each button in order to detect whether or not a finger is present. Typically, such a measurement may take 250 microseconds (μs) including the time taken to make the actual measurement and the associated processing time. Therefore, in a 40-button system it may take 10 ms to detect whether or not a button has been pressed. If the controller consumes 2.5 milliamps (mA) while performing such scanning, the average current consumption of the device when no button is pressed is approximately 250 micro amps (μA). Such a high "sleep" current is regarded as being unacceptable by most remote control manufacturers because of the resulting short battery life, and capacitance sensing has therefore not been widely used in remote controls and other battery-powered devices.

Similar high sleep current is present in track pads and sliders, but the applications are often more tolerant of a high sleep current, because of the usage models of such devices. Even in these applications, a reduction in sleep current would still be beneficial.

Using capacitance sensing in remote controls may result in high "sleep" current when no finger is present on the device in order to be able to quickly detect the presence of a finger when that occurs. Also, the key matrices cannot be built in very small areas because it is limited by the pull-up resistor and mechanical button for each button. For example, the mechanical button of each button may have an area of about 0.5 centimeters (cm)×0.5 cm.

BRIEF DESCRIPTION OF THE DRAWINGS

The present invention is illustrated by way of example, and not by way of limitation, in the figures of the accompanying drawings.

FIG. 1C illustrates scan results for no keyboard keys pressed on a conventional key matrix.

FIG. 1D illustrates scan results for a keyboard key pressed on a conventional key matrix.

DETAILED DESCRIPTION

Figure 1A:
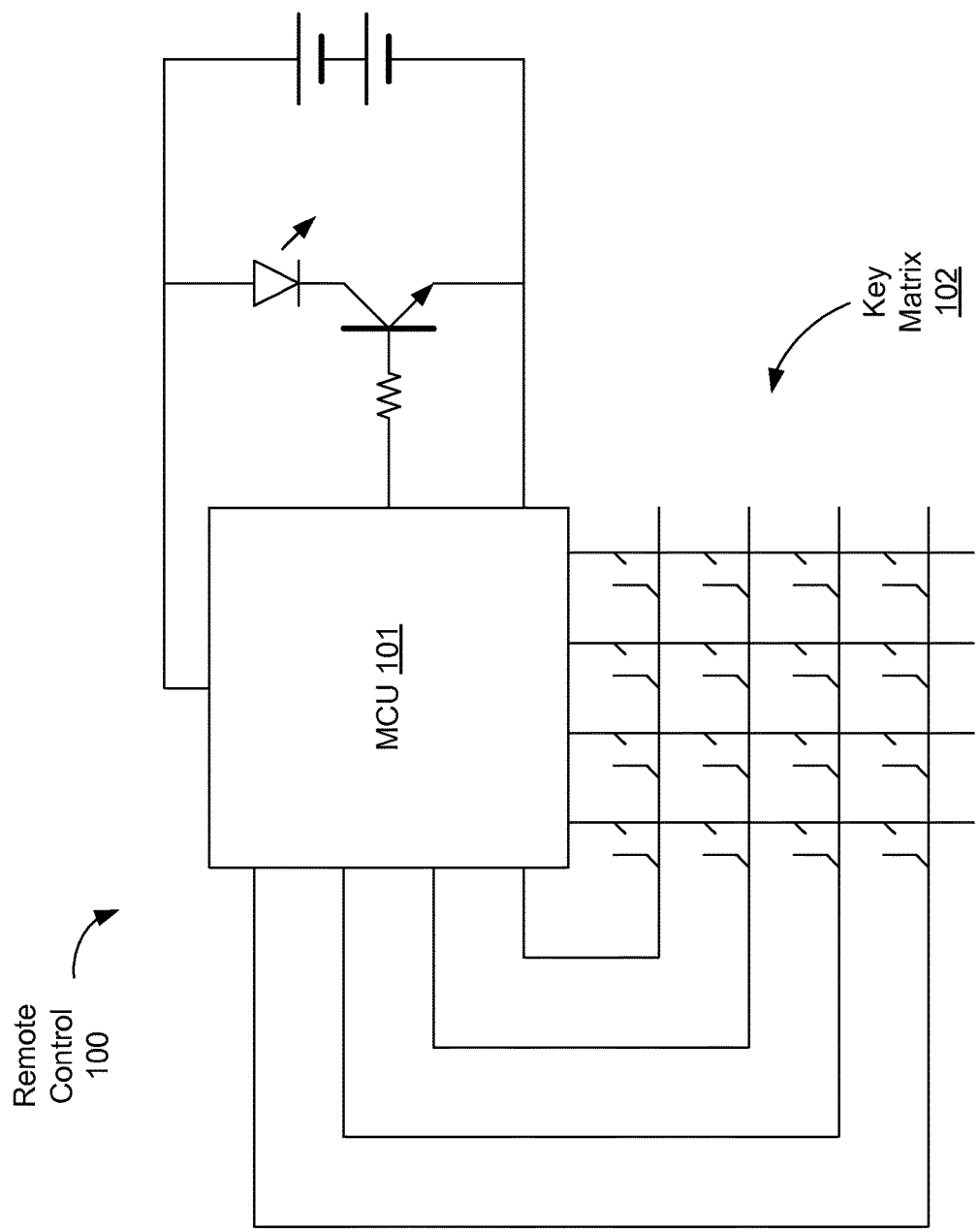
FIG. 1A illustrates a block diagram of a conventional remote control having multiple buttons.
Figure 1B:
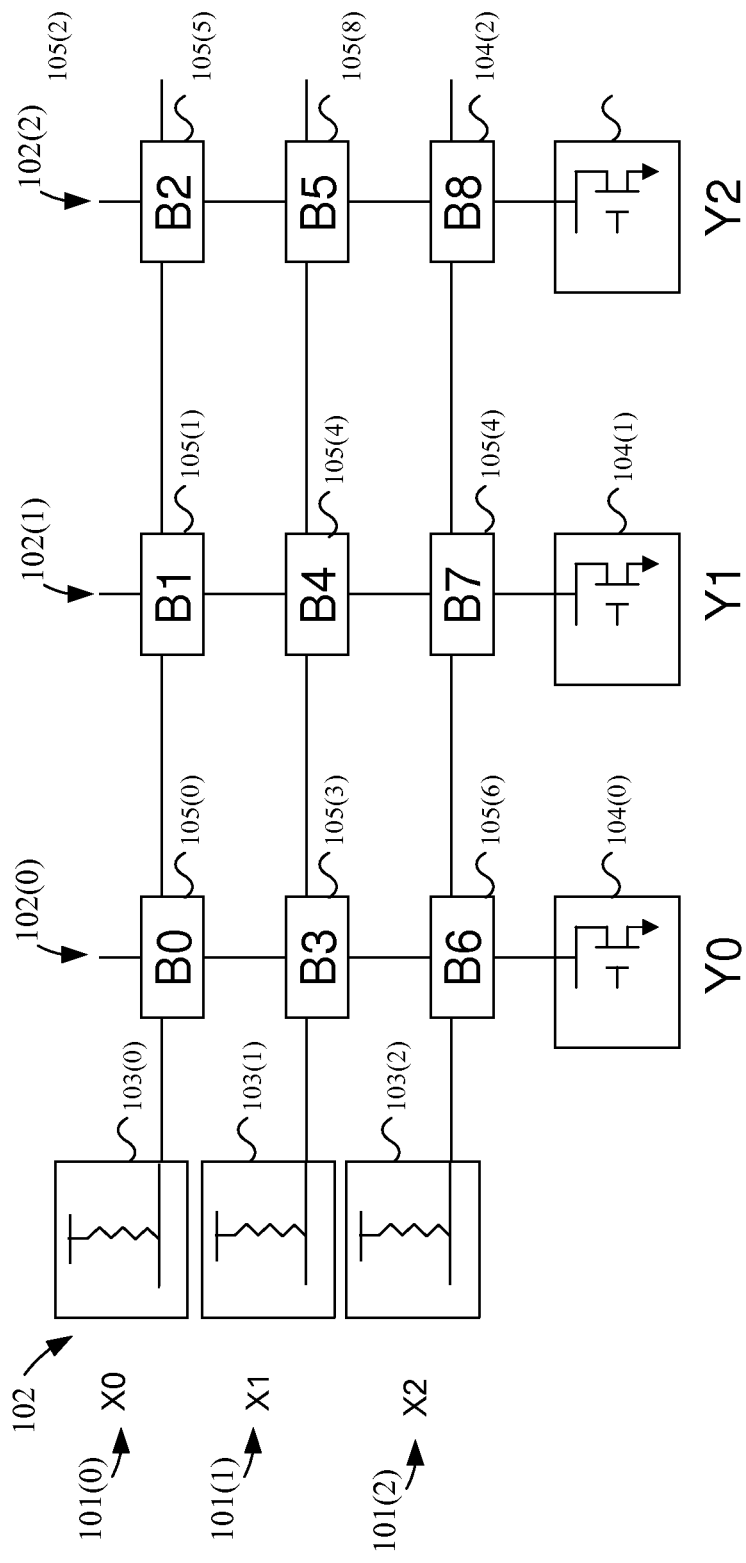
FIG. 1B illustrates a key matrix of a conventional keyboard.

Described herein are an apparatus and a method for reducing power consumption in a capacitance sensing device in a reduced power mode. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus are described to couple a group of sensor elements together in one mode to collectively measure a capacitance on the group of sensor elements, in addition to individually measuring a capacitance on each of the sensor elements in another mode. In one embodiment of the method, if, while individually measuring the capacitance on each of the sensor elements, a presence of a conductive object is not detected, then a group of sensor elements are coupled together and a capacitance on the group of sensor elements is collectively measured. In one embodiment, the apparatus includes a processing device, and multiple sensor elements coupled to the processing device. The processing device may be individually coupled to the processing device in a first mode, and a group of sensor elements are collectively coupled to the processing device in a second mode when a presence of a conductive object is not detected on the multiple sensor elements in the first mode.

Touch-sensitive devices operate on a scanning basis. Each sensor element is connected to the capacitance sensing circuit in turn through an electronic switch, and its capacitance is measured. When no finger is present (e.g., the capacitance to ground from all sensor elements is small), in some embodiments a "coarse" measurement of capacitance is made, measuring the capacitance of each of the sensor elements in turn. If this coarse measure measurement is greater than a certain pre-determined minimum value, then a more accurate measurement is made of the capacitance on all of the sensor elements. However, it can be seen that for a system with a large number of buttons, a long slider, or a touchpad, that many capacitance measurements are made in order simply to detect whether or not a finger is present.

The embodiments described herein, rather than measuring the capacitance of each of the sensor elements in turn, a group of the sensor elements are connected together, and a single "coarse" measurement of the total aggregate capacitance on the group of sensor elements is made. If the total aggregate capacitance is greater than a pre-determined minimum value, then scanning the sensor elements individually can be used to determine which button has been pressed, or where on the slider or touchpad the finger is located.

In one embodiment, the group of sensor elements can be all of the sensor elements in the touch-sensitive device. This may be done in some cases where the touch-sensor buttons are separated from one another (e.g., not adjacent to one another) and a finger on or near one button does not cause significant rise in capacitance on the other separated buttons. Alternatively, when the sensor elements are sufficiently close together, a detectable change in capacitance may be measured using less than all of the sensor elements, for example, ½, ⅓, ¼, or other fractions of the sensor elements can be coupled together in alternating or non-alternating patterns. For example, every other sensor element is coupled together to collectively measure the capacitance, and a finger on or near an unconnected sensor element does cause significant rise in capacitance on the alternating coupled sensor elements to measure a detectable change in capacitance. In one exemplary embodiment, when implementing a slider, which includes a number of closely-located sensor elements, half of the sensor elements may be coupled together for collectively measuring the capacitance on the slider (e.g., "coarse" measurement) in the second mode, and all of the sensor elements are individually measured in the first mode. This may have the advantage of reducing the background "parasitic" capacitance to ground, and thus, reducing the time taken to make the "coarse" measurement in the second mode since less than all of the sensor elements are coupled together in the second mode. Similarly, in one embodiment of a touchpad implementation, only the rows or columns, but not both may be connected together when taking the "coarse" measurement on the coupled sensor elements during the second mode. In another embodiment, only half of the rows or columns (e.g., alternating rows or columns) are coupled together to make the "coarse" measurement during the second mode. Alternatively, other configurations are possible.

By making only a single capacitance measurement during each sensing interval when no finger (or other conductive object) is present, the time taken to determine whether a finger has recently become present is greatly reduced. Thus, the power consumption in "sleep" mode is similarly reduced, such as by reducing the "sleep" current in the "sleep" mode. The "sleep" mode is a reduced power mode, as compared to the active or normal mode. The parasitic capacitance of the sensor elements to ground may be greater when all of the sensor elements are connected together than for an individual sensor element, and the time taken to measure the capacitance may be proportional to the capacitance to ground. For example, in the 40-button remote control example, the time taken to measure the capacitance of all 40 buttons connected together may be 500 μs, as opposed to the 250 μs for an individual button. As such, when implementing the embodiments described herein, the "sleep" current may be reduced from 250 μA to 12.5 μA. The embodiments described herein may provide an advantage of using capacitance sensing in remote control and other battery-operated devices because the power consumption in the reduced power mode is reduced.

The embodiments described herein have other applications apart from reducing sleep current. As the combined area of all or a fraction of the sensor elements is much greater than that of a single sensor element, the capacitance between the combined area and a finger that is close, but not touching the sensor elements is much greater than between the finger and a single sensor element. As such, the capacitance on the connected sensor elements can be more accurately measured than the capacitance on the single sensor element. This characteristic may be used to provide additional features, such as, for example, a remote control could potentially detect a hand moved over it at several inches distance. This could be used to turn on a backlight, enabling a user to locate the remote control in a dark room simply by waving a hand over the approximate location of the remote control, for example, on a side table. Similarly, the embodiments described herein may be used to detect and interpret gestures made in the air over the touch-sensitive device (e.g., touchpad); such gestures could be separate from and independent of the usual gestures typically recognized by the touch-sensitive device. For example, in one embodiment, the page-up and page-down gestures are activated by waving a finger or hand over the top of the touch-sensitive device (e.g., touchpad) without touching the surface. Alternatively, other types of gestures may be implemented.

It should be noted that in other embodiments, the capacitance sensing applications may use a pair of capacitance sensing circuits, allowing two buttons (or sensor elements of a touchpad or a slider) to be sensed simultaneously. In one embodiment, half of the sensor elements active in "sleep" mode may be connected to each of the sensing circuits, and two "coarse" capacitance measurements are made simultaneously. This may have the advantage of reducing the time taken to make the capacitance measurement, as the parasitic capacitance of each group is less than the parasitic capacitance when both groups are combined.

The embodiments described herein may provide an advantage over conventional capacitance sensing systems by reducing sleep current to a level where capacitance sensing becomes a viable option for in applications where the current consumption of conventional capacitance sensing systems is unacceptably high. The embodiments described herein may also provide the benefit of increasing battery life of the device. The embodiments described herein may also enable detection of conductive objects (e.g., fingers or hands) at greater distances than conventional systems.

It should be noted that the embodiments described herein are different than sensing devices that use a 2-stage sensing process. In the 2-stage sensing process, the sensor elements are divided into multiple groups, and each group of sensor elements is connected together and the aggregate capacitance of each group is measured to determine in which group the finger is detected. Then when it has been determined in which group the finger is located, each of the sensor elements of that group is sensed individually. In the embodiments described herein, only a single group of sensor elements (e.g., a fraction or all of the sensor elements) is measured, rather than multiple groups of sensor elements that measured each in turn. The embodiments described herein also only measure a group of coupled sensor elements when no conductive object is detected on the device.

Figure 2:
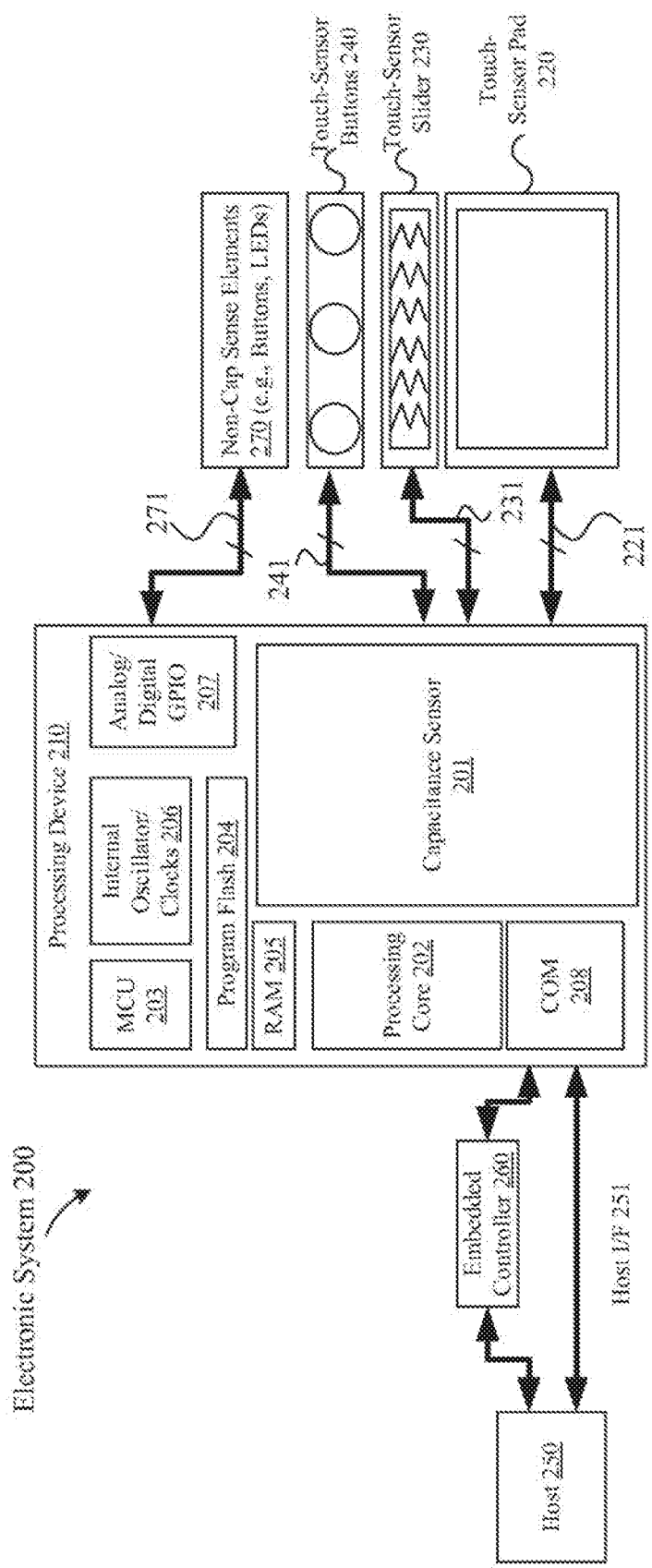
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems) using, in one embodiment, configurable user modules ("UMs"). The digital block array may be coupled to a system bus (not illustrated). Processing device 210 may also include memory, such as random access memory (RAM) 205 and program flash 204. RAM 205 may be static RAM (SRAM) or the like, and program flash 204 may be a non-volatile storage, or the like, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 210 are described in more detail below.

It should be noted that the embodiments described herein are not limited to touch-sensor pads for notebook implementations, but can be used in other capacitive sensing implementations, for example, the sensing device may be a touch screen, a touch-sensor slider 230, or a touch-sensor button 240 (e.g., capacitance sensing button). It should also be noted that the embodiments described herein may be implemented in other sensing technologies than capacitive sensing, such as resistive, optical imaging, surface acoustical wave (SAW), infrared, dispersive signal, and strain gauge technologies. Similarly, the operations described herein are not limited to notebook pointer operations, but can include other operations, such as lighting control (dimmer), temperature or environmental control, volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition and numeric keypad operation.

In one embodiment, the electronic system 200 includes a touch-sensor pad 220 coupled to the processing device 210 via bus 221. Touch-sensor pad 220 may include a two-dimension sensor array. The two-dimension sensor array includes multiple sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. In another embodiment, the electronic system 200 includes touch-sensor buttons 240 coupled to the processing device 210 via bus 241. Touch-sensor button 240 may include a single-dimension or multi-dimension sensor array. The single- or multi-dimension sensor array includes multiple sensor elements. For a touch-sensor button, the sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitance sensor element. Capacitance sensor elements may be used as non-contact sensors. These sensor elements, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, a display, or other functional keys that do not require capacitance sensing. In one embodiment, buses 271, 241, 231, and 221 may be a single bus. Alternatively, these buses may be configured into any combination of one or more separate buses.

The processing device 210 may also provide value-added functionality such as keyboard control integration, LEDs, battery charger, and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via a low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface 251. Alternatively, the processing device 210 may communicate to external components, such as the host 250 using industry standard interfaces, such as USB, PS/2, inter-integrated circuit (I2C) bus, system packet interfaces (SPI), or the like. The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 200 may operate in both standard-mouse compatible and enhanced modes. The standard-mouse compatible mode utilizes the HID class drivers already built into the Operating System (OS) software of host 250. These drivers enable the processing device 210 and sensing device to operate as a standard pointer control user interface device, such as a two-button PS/2 mouse. The enhanced mode may enable additional features such as scrolling or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the pointer, scroll-up, scroll-down, scroll-left, scroll-right, step Back, and step Forward. In another embodiment, the data sent to the host 250 includes the position or location of the conductive object on the sensing device. Alternatively, other user interface device commands may be communicated to the host 250 from the processing device 210. These commands may be based on gestures occurring on the sensing device that are recognized by the processing device, such as tap, push, hop, drag, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered a movement of the pointer, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC®) processing device, developed by Cypress Semiconductor Corporation, San Jose, California. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 210 may also be done in the host. In another embodiment, the processing device 210 is the host.

In one embodiment, the method and apparatus described herein may be implemented in a fully self-contained touch-sensor pad, which outputs fully processed x/y movement and gesture data signals or data commands to a host. In another embodiment, the method and apparatus may be implemented in a touch-sensor pad, which outputs x/y movement data and finger presence data to a host, and where the host processes the received data to detect gestures. In another embodiment, the method and apparatus may be implemented in a touch-sensor pad, which outputs raw capacitance data to a host, where the host processes the capacitance data to compensate for quiescent and stray capacitance, and calculates x/y movement and detects gestures by processing the capacitance data. Alternatively, the method and apparatus may be implemented in a touch-sensor pad, which outputs pre-processed capacitance data to a host, where the touchpad processes the capacitance data to compensate for quiescent and stray capacitance, and the host calculates x/y movement and detects gestures from the pre-processed capacitance data. Alternatively, other configurations are possible.

In one embodiment, the electronic system that includes the embodiments described herein may be implemented in a conventional laptop touch-sensor pad. Alternatively, it may be implemented in a wired or wireless keyboard integrating a touch-sensor pad, which is connected to a host. In such an implementation, the processing described above as being performed by the "host" may be performed in part or in whole by the keyboard controller, which may then pass fully processed, pre-processed or unprocessed data to the system host. In another embodiment, the embodiments may be implemented in a mobile handset (e.g., cellular or mobile phone) or other electronic devices where the touch-sensor pad may operate in one of two or more modes. For example, the touch-sensor pad may operate either as a touch-sensor pad for x/y positioning and gesture recognition, or as a keypad or other arrays of touch-sensor buttons and/or sliders. Alternatively, the touch-sensor pad, although configured to operate in the two modes, may be configured to be used only as a keypad.

Capacitance sensor 201 may be integrated into the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware description language, such as VHDL or Verilog, and stored to a machine-accessible medium (e.g., Flash ROM, CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above, or include additional components not listed herein.

In one embodiment, electronic system 200 may be used in a notebook computer. Alternatively, the electronic device may be used in other applications, such as a mobile handset, a personal data assistant (PDA), a kiosk, a keyboard, a television, a remote control, a monitor, a handheld multimedia device, a handheld video player, a handheld gaming device, or a control panel.

In one embodiment, capacitance sensor 201 may be a capacitance sensing relaxation oscillator (CSR). The CSR may be coupled to an array of sensor elements using a current-programmable relaxation oscillator, an analog multiplexer, digital counting functions, and high-level software routines to compensate for environmental and physical sensor element variations. The sensor array may include combinations of independent sensor elements, sliding sensor elements (e.g., touch-sensor slider), and touch-sensor sensor element pads (e.g., touch pad or touch screen) implemented as a pair of orthogonal sliding sensor elements. The CSR may include physical, electrical, and software components. The physical components may include the physical sensor element itself, typically a pattern constructed on a printed circuit board (PCB) with an insulating cover, a flexible membrane, or a transparent overlay. The electrical component may include an oscillator or other means to convert a capacitance into a measured value. The electrical component may also include a counter or timer to measure the oscillator output. The software component may include detection and compensation algorithms to convert the count value into a sensor element detection decision (also referred to as switch detection decision). For example, in the case of slider sensor elements or X-Y touch-sensor sensor element pads, a calculation for finding position of the conductive object to greater resolution than the physical pitch of the sensor elements may be used.

It should be noted that there are various known methods for measuring capacitance. Although some embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, sigma-delta modulators, charge-accumulation circuits, or the like.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal may be recovered with a synchronous demodulator, which may be done in the processing device 210. The charge transfer may be conceptually similar to an R-C charging circuit. In this method, C is the capacitance being sensed. $C_{SUM}$ is the summing capacitor, into which charge is transferred on successive cycles. At the start of the measurement cycle, the voltage on $C_{SUM}$ is discharged. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 3A:
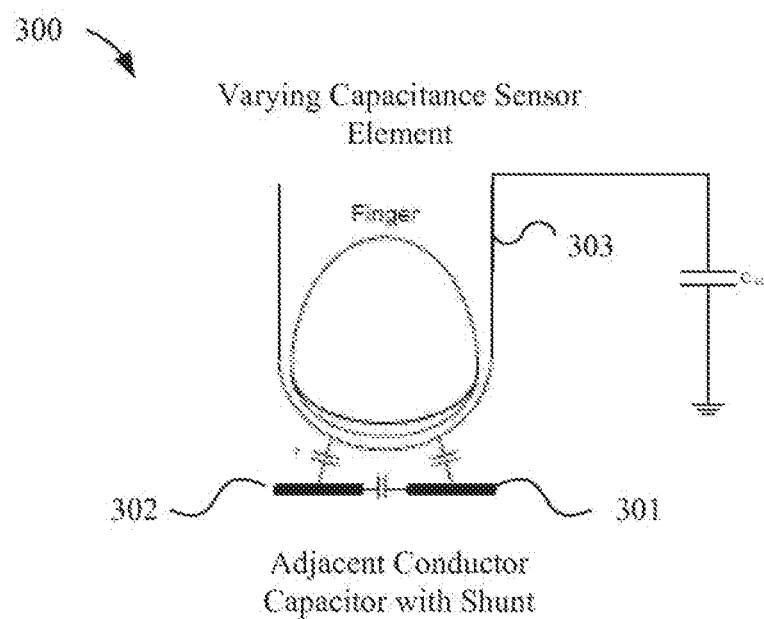
FIG. 3A illustrates a varying capacitance sensor element.

FIG. 3A illustrates a varying capacitance sensor element. In its basic form, a capacitance sensor element 300 is a pair of adjacent conductors 301 and 302. There is a small edge-to-edge capacitance, but the intent of sensor element layout is to minimize the parasitic capacitance $C_P$ between these conductors. When a conductive object 303 (e.g., finger) is placed in proximity to the two conductors 301 and 302, there is a capacitance between electrode 301 and the conductive object 303 and a similar capacitance between the conductive object 303 and the other electrode 302. The capacitance between the electrodes when no conductive object 303 is present is the base capacitance $C_P$ that may be stored as a baseline value. There is also a total capacitance ($C_P+C_F$) on the sensor element 300 when the conductive object 303 is present on or in close proximity to the sensor element 300. The baseline capacitance value $C_P$ may be subtracted from the total capacitance when the conductive object 303 is present to determine the change in capacitance (e.g., capacitance variation $C_F$) when the conductive object 303 is present and when the conductive object 303 is not present on the sensor element. Effectively, the capacitance variation $C_F$ can be measured to determine whether a conductive object 303 is present or not (e.g., sensor activation) on the sensor element 300.

Capacitance sensor element 300 may be used in a capacitance sensor array. The capacitance sensor array is a set of capacitors where one side of each capacitor is connected to a system ground. When the capacitance sensor element 300 is used in the sensor array, when the conductor 301 is sensed, the conductor 302 is connected to ground, and when the conductor 302 is sensed, the conductor 301 is connected to ground. Alternatively, when the sensor element is used for a touch-sensor button, the sensor element is sensed and the sensed button area may be surrounded by a fixed ground. The presence of the conductive object 303 increases the capacitance ($C_P+C_F$) of the sensor element 300 to ground. Determining sensor element activation is then a matter of measuring change in the capacitance ($C_F$) or capacitance variation. Sensor element 300 is also known as a grounded variable capacitor.

The conductive object 303 in this embodiment has been illustrated as a finger. Alternatively, this technique may be applied to any conductive object, for example, a conductive door switch, position sensor, or conductive pen in a stylus tracking system (e.g., stylus).

The capacitance sensor element 300 is known as a projected capacitance sensor. Alternatively, the capacitance sensor element 300 may be a surface capacitance sensor that does not make use of rows or columns, but instead makes use of a single linearized field, such as the surface capacitance sensor described in U.S. Pat. No. 4,293,734. The surface capacitance sensor may be used in touch screen applications.

Figure 3B:
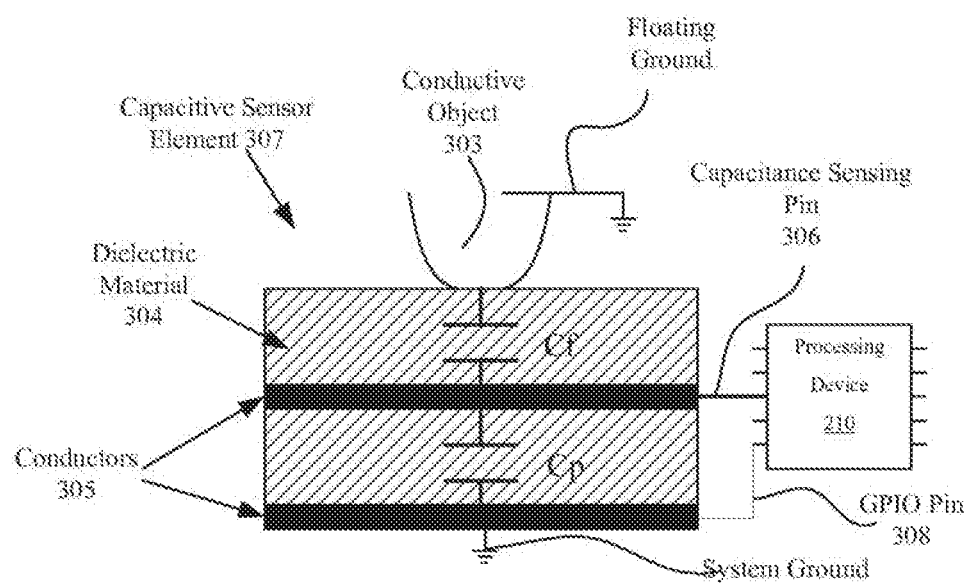
FIG. 3B illustrates one embodiment of a sensing device coupled to a processing device.

FIG. 3B illustrates one embodiment of a capacitance sensor element 307 coupled to a processing device 210. Capacitance sensor element 307 illustrates the capacitance as seen by the processing device 210 on the capacitance sensing pin 306. As described above, when a conductive object 303 (e.g., finger) is placed in proximity to one of the conductors 305, there is a capacitance, $C_F$, between the one of the conductors 305 and the conductive object 303 with respect to ground. This ground, however, may be a floating ground. Also, there is a capacitance, $C_P$, between the conductors 305, with one of the conductors 305 being connected to a system ground. The grounded conductor may be coupled to the processing device 210 using GPIO pin 308. The conductors 305 may be metal, or alternatively, the conductors may be conductive ink (e.g., carbon ink), conductive ceramic (e.g., transparent conductors of indium tin oxide (ITO)), conductive polymers, or the like. In one embodiment, the grounded conductor may be an adjacent sensor element. Alternatively, the grounded conductor may be other grounding mechanisms, such as a surrounding ground plane. Accordingly, the processing device 210 can measure the change in capacitance, capacitance variation $C_F$, as the conductive object is in proximity to one of the conductors 305. Above and below the conductor that is closest to the conductive object 303 is dielectric material 304. The dielectric material 304 above the conductor 305 can be an overlay. The overlay may be non-conductive material used to protect the circuitry from environmental conditions and electrostatic discharge (ESD), and to insulate the user's finger (e.g., conductive object) from the circuitry. Capacitance sensor element 307 may be a sensor element of a touch-sensor pad, a touch-sensor slider, or a touch-sensor button.

Figures 3C, 3D:
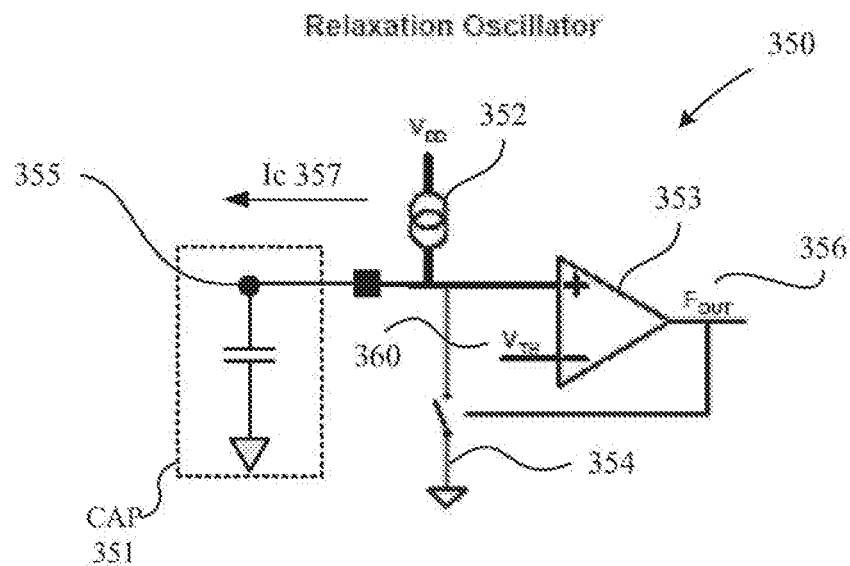
FIG. 3C illustrates one embodiment of a relaxation oscillator for measuring capacitance on a sensor element.
FIG. 3D illustrates a schematic of one embodiment of a circuit including a sigma-delta modulator and a digital filter for measuring capacitance on a sensor element.

FIG. 3C illustrates one embodiment of a relaxation oscillator. The relaxation oscillator 350 is formed by the capacitance to be measured on capacitor 351, a charging current source 352, a comparator 353, and a reset switch 354 (also referred to as a discharge switch). It should be noted that capacitor 351 is representative of the capacitance measured on a sensor element of a sensor array. The relaxation oscillator is coupled to drive a charging current (Ic) 357 in a single direction onto a device under test ("DUT") capacitor, capacitor 351. As the charging current piles charge onto the capacitor 351, the voltage across the capacitor increases with time as a function of Ic 357 and its capacitance C. Equation (1) describes the relation between current, capacitance, voltage, and time for a charging capacitor.

$$CdV = I_c dt \qquad (1)$$

The relaxation oscillator begins by charging the capacitor 351, at a fixed current Ic 357, from a ground potential or zero voltage until the voltage across the capacitor 351 at node 355 reaches a reference voltage or threshold voltage, $V_{TH}$ 360. At the threshold voltage $V_{TH}$ 360, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This discharges the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357.

The comparator trip time of the comparator 353 and reset switch 354 add a fixed delay. The output of the comparator 353 is synchronized with a reference system clock to guarantee that the reset time is long enough to completely discharge capacitor 351. This sets a practical upper limit to the operating frequency. For example, if capacitance C of the capacitor 351 changes, then $f_{RO}$ changes proportionally according to Equation (1). By comparing $f_{RO}$ of $F_{OUT}$ 356 against the frequency ($f_{REF}$) of a known reference system clock signal (REF CLK), the change in capacitance ΔC can be measured. Accordingly, equations (2) and (3) below describe that a change in frequency between $F_{OUT}$ 356 and REF CLK is proportional to a change in capacitance of the capacitor 351.

$$\Delta C \propto \Delta f, \text{ where} \qquad (2)$$

$$\Delta f = f_{RO} - f_{REF} \qquad (3)$$

In one embodiment, a frequency comparator may be coupled to receive relaxation oscillator clock signal ($F_{OUT}$ 356) and REF CLK, compare their frequencies $f_{RO}$ and $f_{REF}$, respectively, and output a signal indicative of the difference Δf between these frequencies. By monitoring Δf one can determine whether the capacitance of the capacitor 351 has changed.

In one exemplary embodiment, the relaxation oscillator 350 may be built using a programmable timer (e.g., 555 timer) to implement the comparator 353 and reset switch 354. Alternatively, the relaxation oscillator 350 may be built using other circuitry. Relaxation oscillators are known by those of ordinary skill in the art, and accordingly, additional details regarding their operation have not been included so as to not obscure the present embodiments. The capacitor charging current for the relaxation oscillator 350 may be generated in a register programmable current output DAC (also known as IDAC). Accordingly, the current source 352 may be a current DAC or IDAC. The IDAC output current may be set by an 8-bit value provided by the processing device 210, such as from the processing core 202. The 8-bit value may be stored in a register, in memory, or the like.

In many capacitance sensor element designs, the two "conductors" (e.g., 301 and 302) of the sensing capacitor are actually adjacent sensor elements that are electrically isolated (e.g., PCB pads or traces), as indicated in FIG. 3A. Typically, one of these conductors is connected to a system ground. Layouts for touch-sensor slider (e.g., linear slide sensor elements) and touch-sensor pad applications have sensor elements that may be immediately adjacent. In these cases, all of the sensor elements that are not active are connected to a system ground through the GPIO 207 of the processing device 210 dedicated to that pin. The actual capacitance between adjacent conductors is small ($C_P$), but the capacitance of the active conductor (and its PCB trace back to the processing device 210) to ground, when detecting the presence of the conductive object 303, may be considerably higher ($C_P + C_F$). The capacitance of two parallel conductors is given by the following equation:

$$C = \varepsilon_0 \cdot \varepsilon_R \cdot \frac{A}{d} = \varepsilon_R \cdot 8.85 \cdot \frac{A}{d} \text{pF/m} \qquad (4)$$

The dimensions of equation (4) are in meters. This is a very simple model of the capacitance. The reality is that there are fringing effects that substantially increase the sensor element-to-ground (and PCB trace-to-ground) capacitance.

There is some variation of sensor element sensitivity as a result of environmental factors. A baseline update routine, which compensates for this variation, may be provided in the high-level APIs.

As described above with respect to the relaxation oscillator 350, when a finger or conductive object is placed on the sensor element, the capacitance increases from $C_P$ to $C_P + C_F$ so the relaxation oscillator output signal 356 ($F_{OUT}$) decreases in frequency. The relaxation oscillator output signal 356 ($F_{OUT}$) may be fed to a digital counter for measurement. There are two methods for counting the relaxation oscillator output signal 356: frequency measurement and period measurement. Additional details of the relaxation oscillator and digital counter are known by those of ordinary skill in the art, and accordingly a detailed description regarding them has not been included. It should also be noted, that the embodiments described herein are not limited to using relaxation oscillators, but may include other sensing circuitry for measuring capacitance, such as versus voltage phase shift measurement, resistor-capacitor charge timing, capacitive bridge divider, charge transfer, sigma-delta modulators, charge-accumulation circuits, or the like.

FIG. 3D illustrates a schematic of one embodiment of a circuit 375 including a sigma-delta modulator 360 and a digital filter 390 for measuring capacitance on a sensor element 351. Circuit 375 includes a switching circuit 370, switching clock source 380, sigma-delta modulator 360, and digital filter 390 for measuring the capacitance on sensor element 351. Sensor element 351 may be a sensor element of a sensor array, and is represented as a switching capacitor $C_X$ in the modulator feedback loop. Alternatively, sensor element 351 may be a single sensor element, such as used in a touch-sensor button. Switching circuit 370 includes two switches $Sw_1$ 371 and $Sw_2$ 372. The switches $Sw_1$ 371 and $Sw_2$ 372 operate in two, non-overlapping phases (also known as break-before-make configuration). These switches together with sensing capacitor $C_x$ 351 form the switching capacitor equivalent resistor, which provides the modulator capacitor $C_{mod}$ 363 of sigma-delta modulator 360 charge current (as illustrated in FIG. 3D) or discharge current (not illustrated) during one of the two phases.

The sigma-delta modulator 360 includes the comparator 361, latch 362, modulator capacitor $C_{mod}$ 363, modulator feedback resistor 365, which may also be referred to as bias resistor 365, and voltage source 366. The output of the comparator may be configured to toggle when the voltage on the modulator capacitor 363 crosses a reference voltage 364. The reference voltage 364 may be a pre-programmed value, and may be configured to be programmable. The sigma-delta modulator 360 also includes a latch 362 coupled to the output of the comparator 361 to latch the output of the comparator 361 for a given amount of time, and provide as an output, output 392. The latch may be configured to latch the output of the comparator based on a clock signal from the gate circuit 382 (e.g., oscillator signal from the oscillator 381). In another embodiment, the sigma-delta modulator 360 includes a synchronized latch that operates to latch an output of the comparator for a pre-determined length of time. The output of the comparator may be latched for measuring or sampling the output signal of the comparator 361 by the digital filter 390.

Sigma-delta modulator 360 is configured to keep the voltage on the modulator capacitor 363 close to reference voltage $V_{ref}$ 364 by alternatively connecting the switching capacitor resistor (e.g., switches $Sw_1$ 371 and $Sw_2$ 372 and sensing capacitor $C_X$ 351) to the modulator capacitor 363. The output 392 of the sigma-delta modulator 360 (e.g., output of latch 362) is feedback to the switching clock circuit 380, which controls the timing of the switching operations of switches $Sw_1$ 371 and $Sw_2$ 372 of switching circuit 370. For example, in this embodiment, the switching clock circuit 380 includes an oscillator 381 and gate 382. Alternatively, the switching clock circuit 380 may include a clock source, such as a spread spectrum clock source (e.g., pseudo-random signal (PRS)), a frequency divider, a pulse width modulator (PWM), or the like. The output 392 of the sigma-delta modulator 360 is used with an oscillator signal to gate a control signal 393, which switches the switches $Sw_1$ 371 and $Sw_2$ 372 in a non-overlapping manner (e.g., two, non-overlapping phases). The output 392 of the sigma-delta modulator 360 is also output to digital filter 390, which filters and/or converts the output into the digital code 391.

In one embodiment of the method of operation, at power on, the modulator capacitor 363 has zero voltage and switching capacitor resistor (formed by sensing capacitor Cx 351, and switches $Sw_1$ 371 and $Sw_2$ 372) is connected between Vdd line 366 and modulator capacitor 363. This connection allows the voltage on the modulator capacitor 363 to rise. When this voltage reaches the comparator reference voltage, $V_{ref}$ 364, the comparator 361 toggles and gates the control signal 393 of the switches $Sw_1$ 371 and $Sw_2$ 372, stopping the charge current. Because the current via bias resistors $R_b$ 365 continues to flow, the voltage on modulator capacitor 363 starts dropping. When it drops below the reference voltage 364, the output of the comparator 361 switches again, enabling the modulator capacitor 363 to start charging. The latch 362 and the comparator 361 set the sample frequency of the sigma-delta modulator 360.

The digital filter 390 is coupled to receive the output 392 of the sigma-delta modulator 360. The output 392 of the sigma-delta modulator 360 may be a single bit bit-stream, which can be filtered and/or converted to numerical values using a digital filter 390. In one embodiment, the digital filter 390 is a counter. In another embodiment, the standard Sinc digital filter can be used. In another embodiment, the digital filter is a decimator. Alternatively, other digital filters may be used for filtering and/or converting the output 392 of the sigma-delta modulator 360 to provide the digital code 391. It should also be noted that the output 392 may be output to the decision logic 402 or other components of the processing device 210, or to the decision logic 451 or other components of the host 250 to process the bitstream output of the sigma-delta modulator 360.

Described below are the mathematical equations that represent the operations of FIG. 3D. During a normal operation mode, the sigma-delta modulator 360 keeps these currents equal in the average by keeping the voltage on the modulator 363 equal to, or close to, the reference voltage $V_{ref}$ 364. The current of the bias resistor $R_b$ 365 is:

$$I_{Rb} = \frac{V_{c\ mod}}{R_b} \qquad (5)$$

The sensing capacitor $C_x$ 351 in the switched-capacitor mode has equivalent resistance:

$$R_c = \frac{1}{f_s C_x} \qquad (6)$$

where $f_s$ is the operation frequency of the switches (e.g., switching circuit 370). If the output 392 of the sigma-delta modulator 360 has a duty cycle of $d_{mod}$, the average current of the switching capacitor 351 can be expressed in the following equation (7):

$$I_c = d_{mod} \frac{V_{dd} - V_{C\ mod}}{R_c} \qquad (7)$$

In the operation mode, $I_{Rb} = I_c$, $V_{Cmod} = V_{ref}$ or:

$$\frac{V_{ref}}{R_b} = d_{mod} \frac{V_{dd} - V_{ref}}{R_c} \qquad (8)$$

or taking into account that the reference voltage 364 is part of supply voltage:

$$V_{ref} = k_d V_{dd}; k_d = \frac{R_1}{R_1 + R_2} \quad (9)$$

The Equation (8) can be rewritten in the following form:

$$d_{mod} = \frac{R_c}{R_b} \frac{k_d}{1 - k_d} = \frac{1}{f_s R_b} \frac{k_d}{1 - k_d} \frac{1}{C_x} \quad (10)$$

The Equation (10) determines the minimum sensing capacitance value, which can be measured with the proposed method at given parameters set:

$$d_{mod} \leq 1, \text{ or: } C_{x\,min} = \frac{1}{f_s R_b} \frac{k_d}{1 - k_d} \quad (11)$$

The resolution of this method may be determined by the sigma-delta modulator duty cycle measurement resolution, which is represented in the following equations:

$$\Delta d_{mod} = \beta \frac{\Delta C_x}{C_x^2}; \quad (12)$$

$$\beta = \frac{1}{f_s R_b} \frac{k_d}{1 - k_d}$$

or after rewriting relatively $\Delta C_x$, we obtain:

$$\Delta C_x = \frac{1}{\beta} \Delta d_{mod} C_x^2 \quad (13)$$

In one exemplary embodiment, the resistance of the bias resistor 365 is 20 k ohms ($R_b$=20 k), the operation frequency of the switches is 12 MHz ($f_s$=12 MHz), the capacitance on the switching capacitor 351 is 15 picofarads ($C_x$=15 pF), and the ratio between Vdd 366 and the voltage reference 364 is 0.25 ($k_d$=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (μs)), for the 12-bit resolution sample, and digital filter as single-type integrator/counter the measurement time is approximately 410 μs (e.g., $2^{12}$*0.1 μs=410 μs). For faster measurement speeds at same resolutions, other types of digital filters may be used, for example, by using the Sinc2 filter, the scanning time at the same resolution may be reduced approximately 4 times. To do this the sensing method should have suitable measurement speed. In one embodiment, a good measurement rate may be accomplished by using a double integrator as the digital filter 390.

Figure 4A:
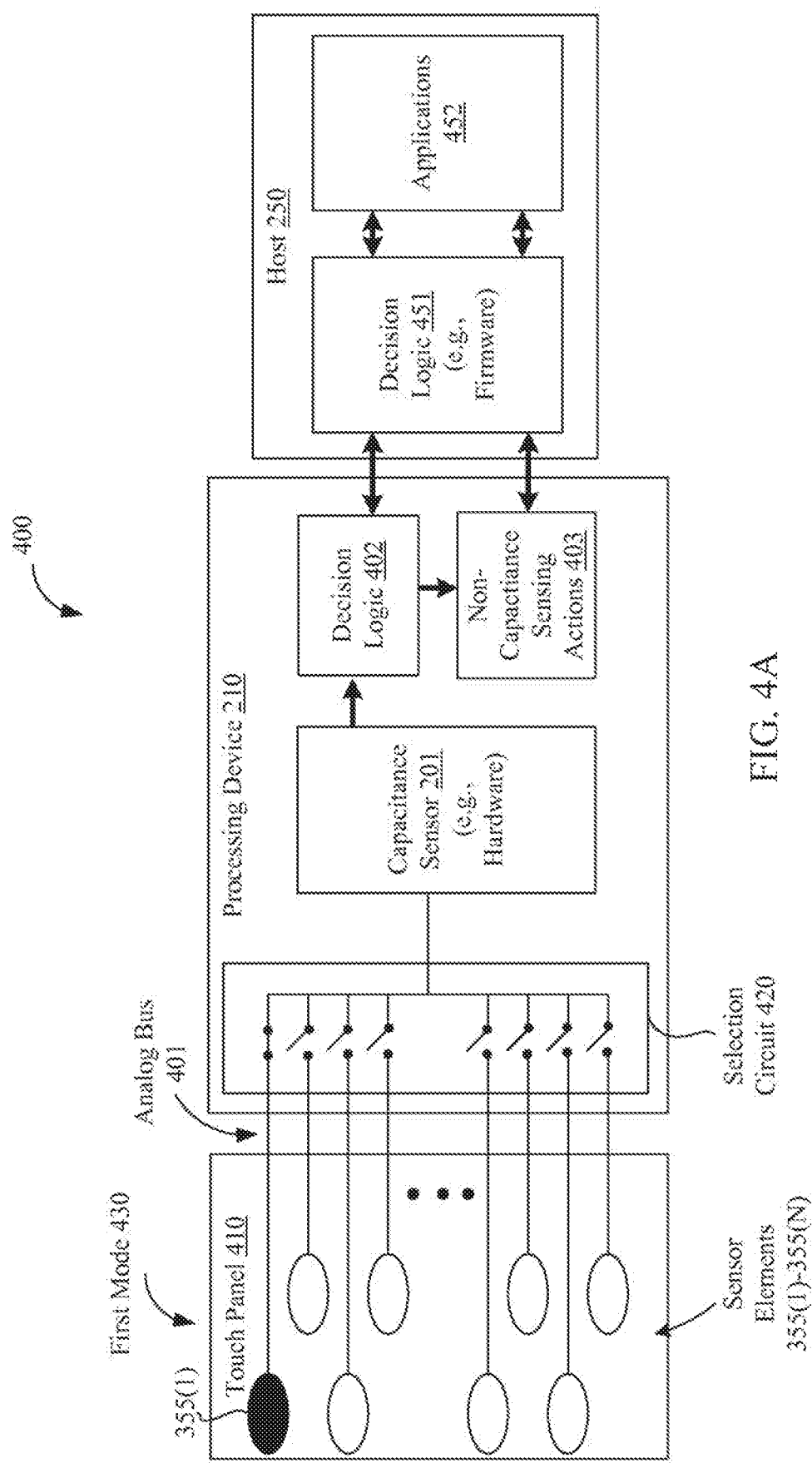
FIG. 4A illustrates a block diagram of one embodiment of an electronic device including a processing device that includes a capacitance sensor for measuring the capacitance on a touch panel in a first mode.

FIG. 4A illustrates a block diagram of one embodiment of an electronic device 400 including a processing device 210 that includes a capacitance sensor 201 for measuring the capacitance on a touch panel 410 in a first mode 430. The electronic device 400 includes the touch panel 410, which includes multiple touch-sensor buttons (e.g., similar to touch-sensor buttons 240 of FIG. 2), processing device 210, and host 250. Touch panel 410 includes sensor elements 355(1)-355(N), where N is a positive integer value that represents the number of touch-sensor buttons of the touch panel 410. Each sensor element 355 corresponds to a button of the touch panel 410. Although the buttons are described as being part of a touch panel, alternatively, the buttons may be separated in multiple touch panels or the buttons may be individually mounted on the device without the use of a touch panel.

The sensor elements 355(1)-355(N) of touch panel 410 are coupled to multiple pins of the processing device 210 via an analog bus 401. Each of the sensor elements 355 is coupled to a pin on the processing device 210. The analog bus 401 is coupled to a selection circuit 420. The selection circuit 420 may be configured to couple the sensor elements 355 individually to the capacitance sensor 201 during the first mode 430 (illustrated in FIG. 4A), and configured to collectively couple a group of sensor elements to the capacitance sensor 201 during the second mode 440 (illustrated in FIG. 4B). For example in the first mode 430, as illustrated in FIG. 4A, the first sensor element 355(1) is selected (as indicated by the black sensor element of the touch panel 410), and coupled to the capacitance sensor 201 to measure the capacitance on the first sensor element 355(1). After the capacitance has been measured on the first sensor element, the selection circuit 420 opens the switch that connects the first sensor element 355(1) to the capacitance sensor 201, and closes another switch that connects the capacitance sensor 201 to a subsequent sensor element. This is repeated to individually measure the capacitance on each of the sensor elements 355 during the first mode 430. The processing device 210 is configured to perform a capacitance measurement on each of the sensor elements 355(1)-355(N) during each sensing interval when in the first mode 430.

In one embodiment, the selection circuit 420 is configured to sequentially select the individual sensor elements. In another embodiment, the selection circuit 420 is configured to sequentially select sets of sensor elements, such as rows or columns, as described below. The selection circuit 420 may be configured to provide charge current or voltage to the selected sensor elements and to measure a capacitance on the selected sensor elements. In one exemplary embodiment, the selection circuit 420 is a multiplexer array. Alternatively, the selection circuit may be other circuitry inside or outside the capacitance sensor 201 to select the sensor element(s) to be measured.

In another embodiment, the capacitance sensor 201 may be used to measure capacitance on all or less than all of the sensor elements of the touch panel 410. Alternatively, multiple capacitance sensors 201 may be used to measure capacitance on all or less than all of the sensor elements of the touch panel 410. In one embodiment, the selection circuit 420 is configured to connect the sensor elements that are not being measured to the system ground. This may be done in conjunction with a dedicated pin in the GP10 port 207.

In one embodiment, the processing device 210 further includes a decision logic block 402. The operations of decision logic block 402 may be implemented in firmware; alternatively, it may be implemented in hardware or software. The decision logic block 402 may be configured to receive the digital code or counts from the capacitance sensor 201, and to determine the state of the touch panel 410, such as whether a conductive object is detected on the touch panel 410, which button has been pressed on the touch panel 410, or the like.

Figure 4B:
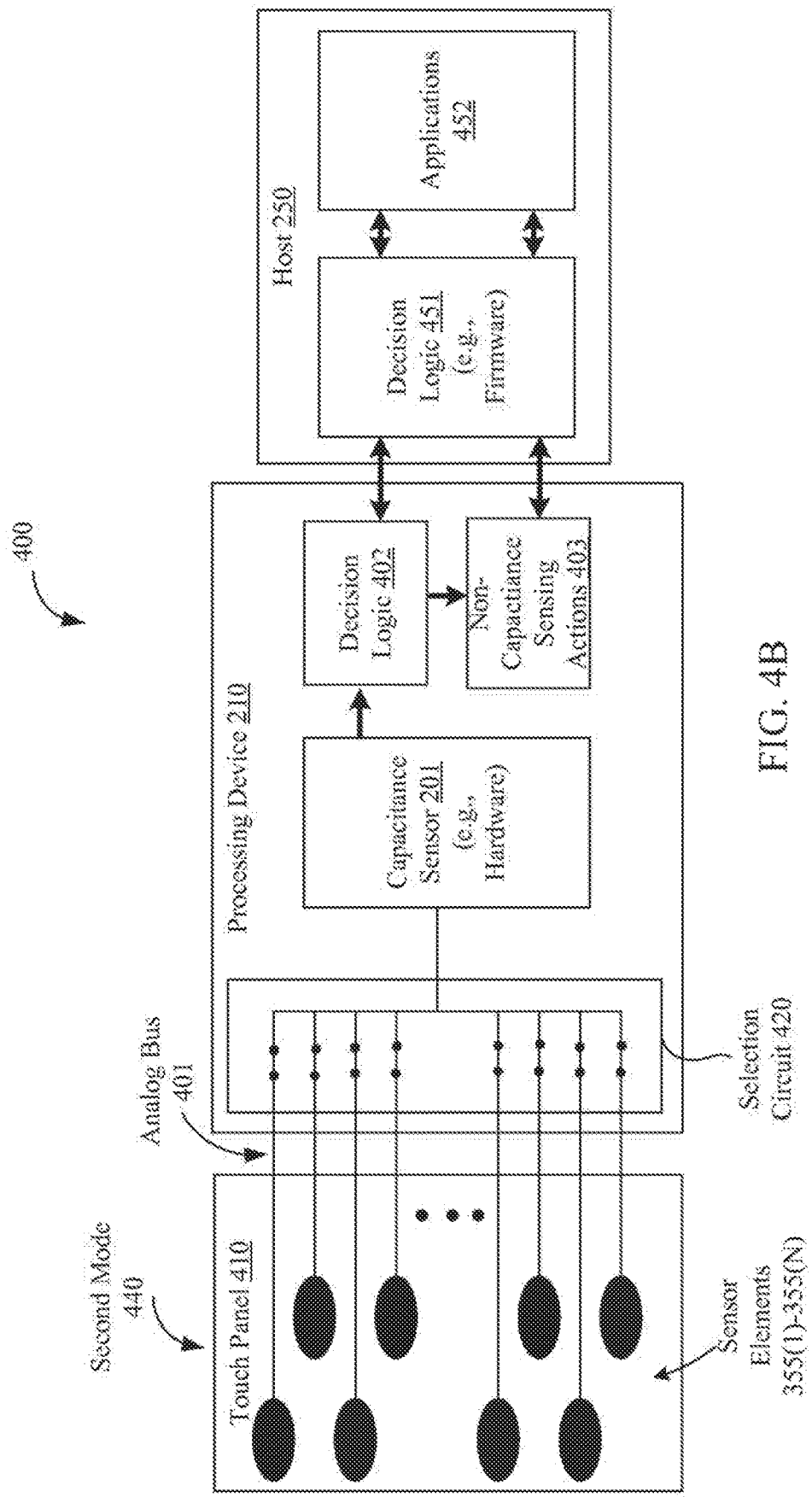
FIG. 4B illustrates the electronic device of FIG. 4A in a second mode.

In another embodiment, instead of performing the operations of the decision logic 402 in the processing device 210, the processing device 201 may send the raw data to the host 250, as described above. Host 250, as illustrated in FIGS. 4A and 4B, may include decision logic 451. The operations of decision logic 451 may also be implemented in firmware, hardware, and/or software. Also, as described above, the host may include high-level APIs in applications 452 that perform routines on the received data, such as compensating for sensitivity differences, other compensation algorithms, baseline update routines, start-up and/or initialization routines, interpolations operations, scaling operations, or the like. The operations described with respect to the decision logic 402 may be implemented in decision logic 451, applications 452, or in other hardware, software, and/or firmware external to the processing device 210.

In another embodiment, the processing device 210 may also include a non-capacitance sensing actions block 403. This block may be used to process and/or receive/transmit data to and from the host 250. For example, additional components may be implemented to operate with the processing device 210 along with the touch panel 410 (e.g., keyboard, keypad, mouse, trackball, LEDs, displays, or the like).

At startup (or boot) the sensor elements (e.g., capacitors 355(1)-(N)) are scanned and the digital code or count values for each sensor element with no activation are stored as a baseline array ($C_P$). The presence of a finger on the sensor element is determined by the difference in counts between a stored value for no sensor element activation and the acquired value with sensor element activation, referred to here as $\Delta n$. The sensitivity of a single sensor element is approximately:

$$\frac{\Delta n}{n} = \frac{C_F}{C_P} \quad (14)$$

The value of $\Delta n$ should be large enough for reasonable resolution and clear indication of sensor element activation. This drives sensor element construction decisions. $C_F$ should be as large a fraction of $C_P$ as possible. Since $C_F$ is determined by finger area and distance from the finger to the sensor element's conductive traces (through the over-lying insulator), the baseline capacitance $C_P$ should be minimized. The baseline capacitance $C_P$ includes the capacitance of the sensor element pad plus any parasitics, including routing and chip pin capacitance.

In one embodiment, the first mode 430 is a normal mode of operation of the electronic device 400. In another embodiment, the first mode 430 is a "fine" measurement mode and is when the electronic device is active, as opposed to being in "sleep" mode (as described below).

FIG. 4B illustrates the electronic device 400 of FIG. 4A in a second mode 440. In the second mode 440, the selection circuit 420 is configured to couple all of the sensor elements 355(1)-355(N) to the capacitance sensor 201 using individual switches. Instead of measuring the capacitance on each of the sensor elements individually as done in the first mode 430, the capacitance sensor 201 collectively measures a total aggregate capacitance on the coupled sensor elements 355(1)-355(N) in the second mode 440. For example, as illustrated in FIG. 4B, all the sensor elements 355(1)-(N) are selected (as indicated by the black sensor elements of the touch panel 410), and coupled to the capacitance sensor 201 to collectively measure the capacitance on all the sensor elements 355(1)-355(N). The processing device 210 is configured to perform a single capacitance measurement on all the sensor elements 355(1)-355(N) during each sensing interval when in the second mode 440.

It should be noted that although the embodiments of FIGS. 4A and 4B illustrate all the sensor elements 355(1)-355(N) being coupled together during the second mode 440, in other embodiments, a fraction of all the sensor elements 355(1)-355(N) may be coupled together during the second mode 440.

The processing device 210 may be configured to individually measure a capacitance on each of the sensor elements 355(1)-355(N) of the electronic device 400 in the first mode 430. The processing device 210 may also be configured to couple a group of (e.g., all or a fraction of) the sensor elements 355(1)-(N), and collectively measure an aggregate capacitance on the group of sensor elements in the second mode 440. The group of sensor elements may be coupled together and the aggregate capacitance measured when a presence of a conductive object is not detected on the sensor elements during the first mode 430 (e.g., no conductive object is detected while individually measuring the capacitance on each of the sensor elements). The electronic device 400 may be placed in a "sleep" mode (e.g., reduced power mode) when the conductive object is not present on the electronic device 400. In another embodiment, the electronic device 400 may be placed in the "sleep" mode after a certain number of individual sensing cycles have resulted in no conductive object being detected on the electronic device 400. During "sleep" mode (e.g., second mode 440), the electronic device 400 can periodically scan the group of coupled sensor elements to determine if a conductive object is present on the electronic device 400. When the electronic device 400 detects the presence of the conductive object in "sleep" mode (e.g., conductive object is detected while collectively measuring a capacitance on the group of sensor elements), the electronic device 400 may be placed in a normal or active mode (e.g., first mode 430).

In one embodiment, the electronic device 400 continues to individually measure the capacitance on each of the sensor elements and is placed in the "sleep" mode (e.g., second mode 440) for a period of time when the conductive object is not present on the device during the first mode 430. The electronic device 400 may be placed in the "sleep" mode (e.g., second mode 440) after the electronic device 400 has not detected a conductive object on the device after a predetermined period of time. Alternatively, the electronic device 400 may be placed in the "sleep" mode after the electronic device 400 has not detected a conductive object on the device after a certain number, N, individual sensing cycles. Once the predetermined period of time has lapsed, the electronic device 400 transitions from the first mode 430 to the second mode 440. This may be done to conserve power consumption in the electronic device 400.

In the second mode 440, the electronic device 400 collectively measures a capacitance on the group of sensor elements after the period of time has lapsed. If the electronic device 400 does not detect a presence of a conductive object during the second mode 440, the electronic device 400 may sleep for another period of time. After this period of time, the electronic device 400 wakes and collectively measures a capacitance on the group of sensor elements. Once the electronic device 400 detects a presence of the conductive object during the second mode 440, the electronic device 400 transitions to the first mode 430 to individually measure a capacitance on each of the sensor elements.

In one embodiment, while in the second mode 440, the processing device 210 performs a baseline measurement on the group of sensor elements after the group of sensor elements are coupled together. The baseline measurement may be representative of the capacitance on the group of sensor elements when a conductive object is not present on the electronic device 400. The baseline measurement may be measured to account for parasitic capacitance in the device. The baseline measurement may be compared against the capacitance measurements made during the second mode 440. For example, when the group of sensor elements is subsequently measured, if the collectively measured capacitance on the group of sensor elements is greater than the baseline measurement, then a presence of a conductive object is detected on the electronic device. If the collectively measured capacitance is greater than the baseline measurement, the electronic device 400 may transition to the first mode 430 to individually measure a capacitance on each of the sensor elements.

In another embodiment, the collectively measured capacitance can be compared to a threshold above the baseline measurement. For example, if the collectively measured capacitance is greater than the threshold above the baseline measurement, then a presence of a conductive object is detected, and the electronic device 400 can transition to the first mode 430 to individually measure the capacitance on each of the sensor elements. Conversely, if the collective measured capacitance is less than the baseline measurement or less than the threshold above the baseline measurement, then a presence of a conductive object is not detected, and the electronic device 400 remains in the second mode 440. The electronic device 400 may be placed in the "sleep" mode for a period of time if the collectively measured capacitance on the group sensor elements is equal to or less than the baseline measurement or the threshold above the baseline measurement.

In one embodiment, the electronic device 400 transitions from the first mode 430 to the second mode 440 when the presence of the conductive object is not detected on the sensor elements while individually measuring the capacitance on each of the sensor elements in the first mode 430. In another embodiment, the electronic device 400 transitions from the second mode 440 to the first mode 430 when the presence of the conductive object is detected on the group of sensor elements while collectively measuring the capacitance on the group of sensor elements in the second mode 440. As described above, the group of sensor elements may include all or a fraction of the sensor elements 355.

Figure 5:
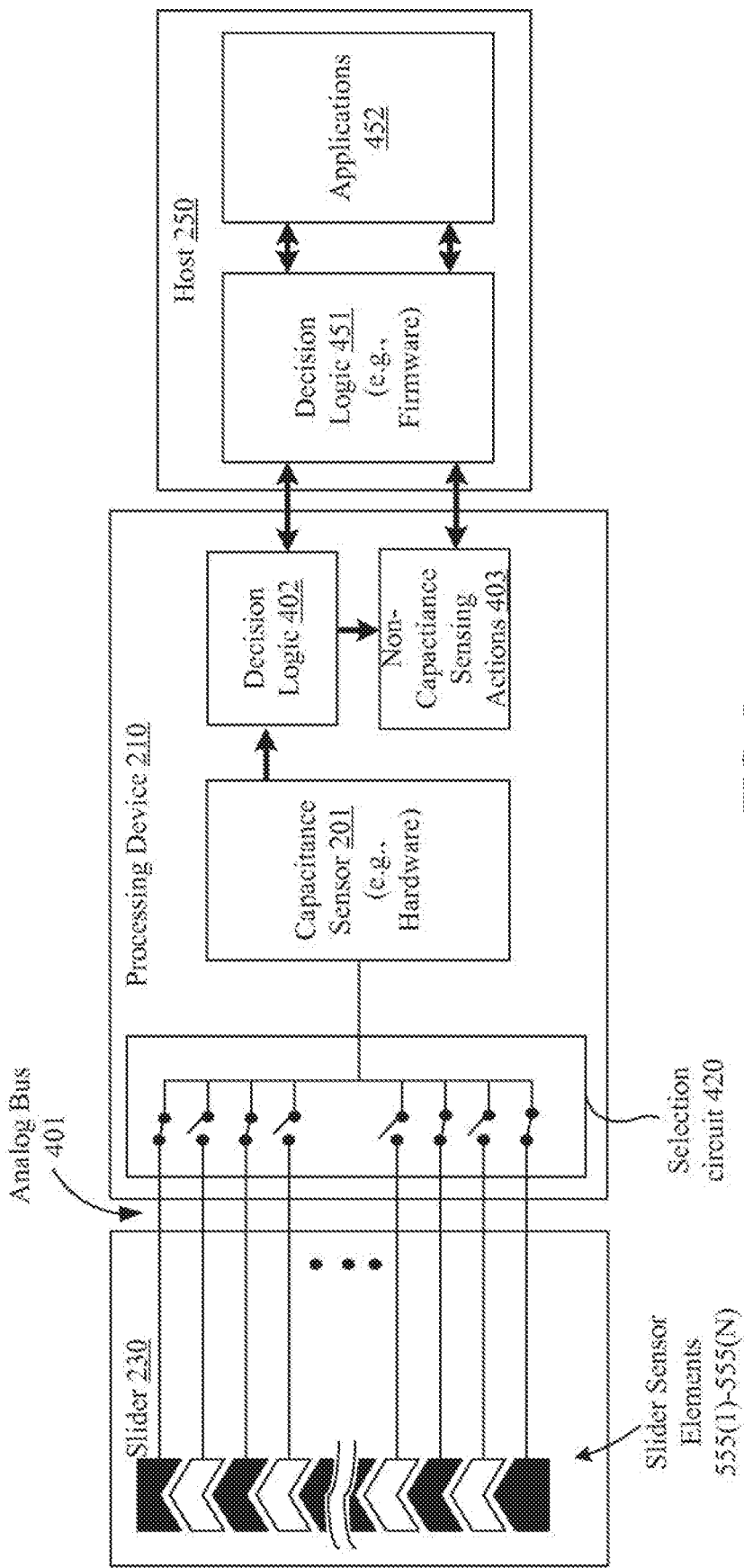
FIG. 5 illustrates a block diagram of one embodiment of an electronic device including a processing device that includes capacitance sensors for measuring the capacitance on a slider.

FIG. 5 illustrates a block diagram of one embodiment of an electronic device 500 including a processing device 210 that includes capacitance sensors 201 for measuring the capacitance on a slider 230. The electronic device 500 is similar to the electronic device 400, except the processing device 210 is coupled to the slider 230 via the selection circuit 420, instead of the touch panel 410.

The slider 230 of FIG. 5 includes multiple sensor elements 555(1)-555(N), where N is a positive integer value that represents the number of sensor elements. In one embodiment, the slider 230 may be a single-dimension sensor array including the sensor elements 555(1)-555(N). The single-dimension sensor array may provide output data to the analog bus 401 of the processing device 210 (e.g., via lines 231 of FIG. 2). The slider 230 may be used for control requiring gradual or discrete adjustments. Examples include a lighting control (dimmer), temperature control, volume control, graphic equalizer, and speed control. Slider controls may also be used for scrolling functions in menus of data. These sensor elements may be mechanically adjacent to one another. Activation of one sensor element may result in partial activation of physically adjacent sensor elements. The actual position in the sliding sensor element is found by computing the centroid location of the set of sensor elements activated, as described below.

The decision logic block 402 may be configured to receive the digital code or counts from the capacitance sensor 201, and to determine the state of the slider 230, such as whether a conductive object is detected on the slider 230, such as which sensor element has been pressed, where the conductive object was detected on the slider 230 (e.g., determining the X-, Y-coordinates of the presence of the conductive object), determining absolute or relative position of the conductive object, whether the conductive object is performing a pointer operation, whether a gesture has been recognized on the slider 230 (e.g., click, double-click, movement of the pointer, scroll-up, scroll-down, scroll-left, scroll-right, step Back, step Forward, tap, push, hop, zigzag gestures, et), or the like.

As described above, the selection circuit 420 is configured to couple each of the sensor elements to the capacitance sensor 201 of the processing device either individually for sequential measurements of the sensor elements in the first mode 430 or collectively for measurements of the coupled sensor elements in the second mode 440. For example, as illustrated in FIG. 5, half of the sensor elements 555(1)-555(N) are selected (as indicated by the black sensor elements of the slider 230) in the second mode 440, and coupled to the capacitance sensor 201 to measure the aggregate capacitance on the coupled sensor elements. However, in the first mode 430, each of the sensor elements 555(1)-555(N) are sequentially selected and coupled to the capacitance sensor 201 of the processing device 210 to individually measure the capacitance on each of the sensor elements 555(1)-555(N). The processing device 210 is configured to perform a capacitance measurement on each of the sensor elements 555(1)-555(N) during each sensing interval when in the first mode 430, and to perform a single capacitance measurement on the coupled sensor elements 555(1)-555(N) (e.g., half of the sensor elements) during each sensing interval when in the second mode 440.

Figure 6:
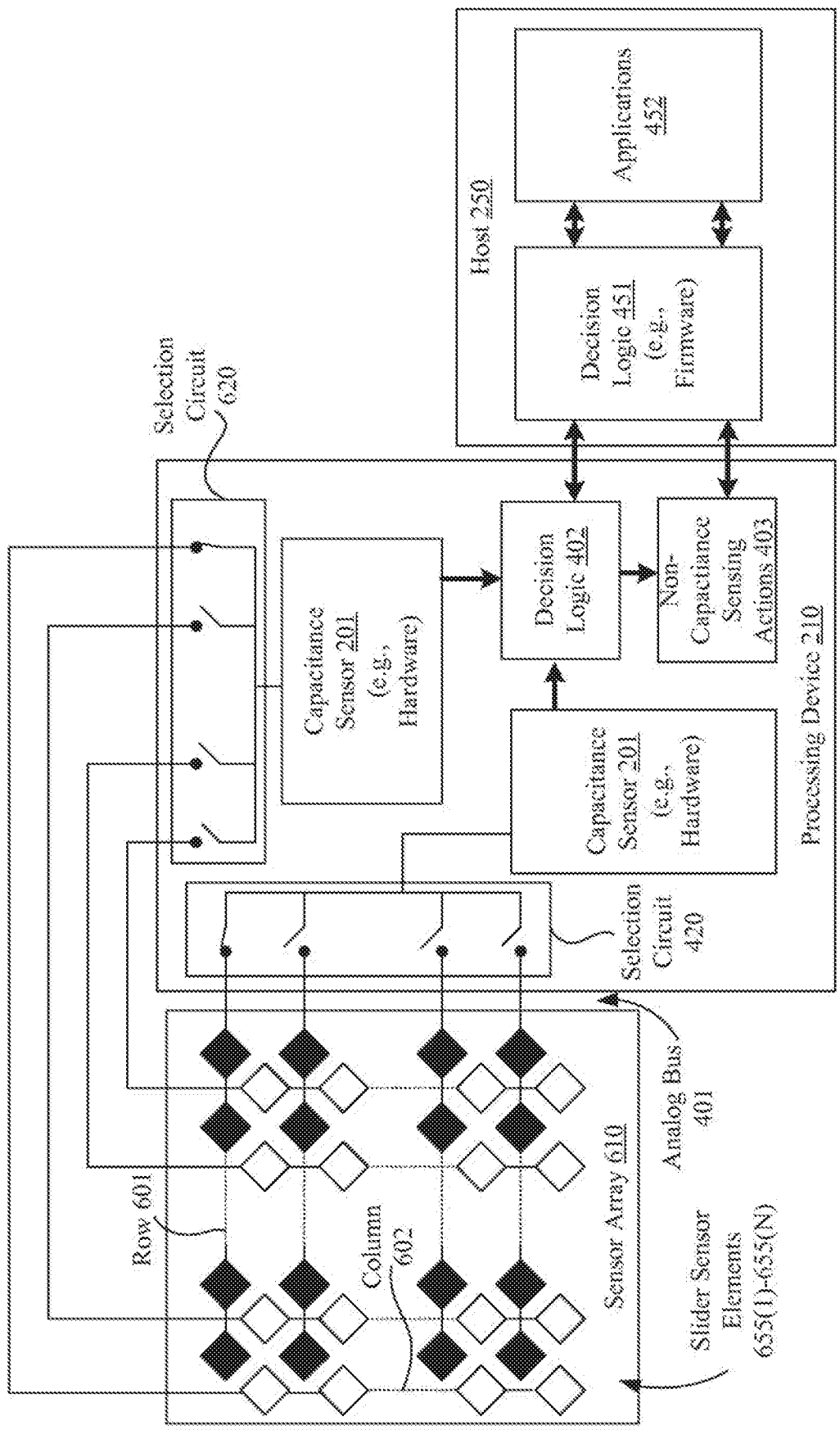
FIG. 6 illustrates a block diagram of one embodiment of an electronic device including a processing device that includes two capacitance sensors for measuring the capacitance on a sensor array.

It should be noted that although the embodiments of FIG. 5 illustrate half of the sensor elements 555(1)-555(N) being coupled together during the second mode 440, in other embodiments, other fractions or all of the sensor elements 555(1)-555(N) may be coupled together during the second mode 440. Coupling less than all of the sensor elements (e.g., a fraction of all the sensor elements) in the second mode 440 may have the advantage of reducing the background parasitic capacitance to ground in the electronic device 500, and thus reduce the time taken to make the single measurement in the second mode 440, as compared to coupling all the sensor elements, and thus further reduce the sleep current FIG. 6 illustrates a block diagram of one embodiment of an electronic device 600 including a processing device 210 that includes two capacitance sensors 201 for measuring the capacitance on a sensor array 610. The electronic device 600 is similar to the electronic devices 400 and 500, except the processing device 210 is coupled to the sensor array 610 using two selection circuits 420 and 620 and two capacitance sensors 201. In one embodiment, the sensor array 610 is implemented in the touch-sensor pad 220, as described with respect to FIG. 2. Alternatively, the sensor array 610 may be implemented in other capacitance sensing devices.

In this embodiment, the sensor array 610 is a two-dimension sensor array including the sensor elements 655(1)-655(N), where N is a positive integer value that represents the number of sensor elements of the two-dimension sensor array. The two-dimension sensor array 610 may provide output data to the analog bus 401 of the processing device 210 (e.g., via bus 221).

The sensing array 610 may be used for similar operation as described above with respect to the touch-sensor pad 220. The decision logic block 402 may be configured to receive the digital code or counts from the capacitance sensor 201, and to determine the state of the sensor array 610, such as whether a conductive object is detected on the sensor array 610, which sensor element of the sensor array 610 has been pressed, where the conductive object was detected on the sensor array 610 (e.g., determining the X-, Y-coordinates of the presence of the conductive object), determining absolute or relative position of the conductive object, whether the conductive object is performing a pointer operation, whether a gesture has been recognized on the sensor array 610 (e.g., click, double-click, movement of the pointer, scroll-up, scroll-down, scroll-left, scroll-right, step Back, step Forward, tap, push, hop, zigzag gestures, etc), or the like.

As described above, the selection circuit 420 is configured to couple each of the sensor elements to the capacitance sensor 201 of the processing device either individually for sequential measurements of the sensor elements in the first mode 430 or collectively for measurements of the coupled sensor elements in the second mode 440. In another embodiment, the selection circuits 420 and 620 are configured to couple each of the sensor elements to the capacitance sensors 201 as sets of sensor elements, such as a row or column of sensor elements. The selection circuits 420 and 620 are configured to substantially and simultaneously measure two sets of sensor elements at a time. For example, as illustrated in FIG. 6, a first row 601 and a first column 602 are selected in the first mode 430, and coupled to the capacitance sensors 201, respectively, to individually measure the capacitance on the first row and the first column of sensor elements. After the capacitance has been measured on the first row 601 and first column 602, the selection circuits 420 and 620 each open the switch that connects the respective capacitance sensor 201 to the first row 601 and first column 602, and closes another switch that connects the respective capacitance sensor 201 to a subsequent row and a subsequent column, respectively. This is repeated to individually measure the capacitance on each of the rows and each of the columns of the sensor array 610 during the first mode 430. The processing device 210 is configured to perform a capacitance measurement on each of the rows and columns during each sensing interval when in the first mode 430. However, in the second mode 440, all of the rows are coupled together to collectively measure an aggregate capacitance on the rows of the sensor array 610. Similarly, in the second mode 440, all of the columns are coupled together to collectively measure an aggregate capacitance on the columns of the sensor array 610. In one embodiment, the processing device 210 is configured to perform a single capacitance measurement on all the rows of the sensor array 610 during each sensing interval when in the second mode 440. In another embodiment, the processing device 210 is configured to perform a single capacitance measurement on all the columns of the sensor array 610 during each sensing interval when in the second mode 440. Alternatively, the processing device 210 is configured to perform both measurements of the all the rows and all the columns during each sensing interval when in the second mode 440.

It should be noted that although the embodiments of FIG. 6 illustrate all of the rows or all of the columns of the sensor array 610 being coupled together during the second mode 440, in other embodiments, fractions of all of the rows or fractions of all of the columns may be coupled together during the second mode 440. For example, half of the columns are coupled together and coupled to the first capacitance sensor 201, and half of the rows are coupled together and coupled to the second capacitance sensor 201. Coupling less than all of the rows and/or columns (e.g., a fraction of all the rows or columns of sensor elements) in the second mode 440 may have the advantage of reducing the background parasitic capacitance to ground in the electronic device 600, and thus reduce the time taken to make the capacitance measurement(s) in the second mode 440, as compared to coupling all the rows and/or all the columns of sensor elements.

The sensor array may be a grid-like pattern of sensor elements (e.g., capacitive elements) used in conjunction with the processing device 210 to detect a presence of a conductive object, such as a finger, to a resolution greater than that which is native. The touch-sensor pad layout pattern may be disposed to maximize the area covered by conductive material, such as copper, in relation to spaces necessary to define the rows and columns of the sensor array.

In applications for touch-sensor sliders (e.g., sliding sensor elements) and touch-sensor pads it is often necessary to determine finger (or other capacitive object) position to greater resolution than the native pitch of the individual sensor elements. The contact area of a finger on a sliding sensor element or a touch-pad is often larger than any single sensor element. In one embodiment, in order to calculate the interpolated position using a centroid, the array is first scanned to verify that a given sensor element location is valid. The requirement is for some number of adjacent sensor element signals to be above a noise threshold. When the strongest signal is found, this signal and those immediately adjacent are used to compute a centroid:

$$\text{Centroid} = \frac{n_{i-1} \cdot (i-1) + n_i i + n_{i+1} \cdot (i+1)}{n_{i-1} + n_i i + n_{i+1}} \quad (15)$$

The calculated value may be fractional. In order to report the centroid to a specific resolution, for example a range of 0 to 100 for 12 sensor elements, the centroid value may be multiplied by a calculated or predetermined scalar. It may be more efficient to combine the interpolation and scaling operations into a single calculation and report this result directly in the desired scale. This may be handled in the high-level APIs. Alternatively, other methods may be used to interpolate the position of the conductive object.

Figure 7:
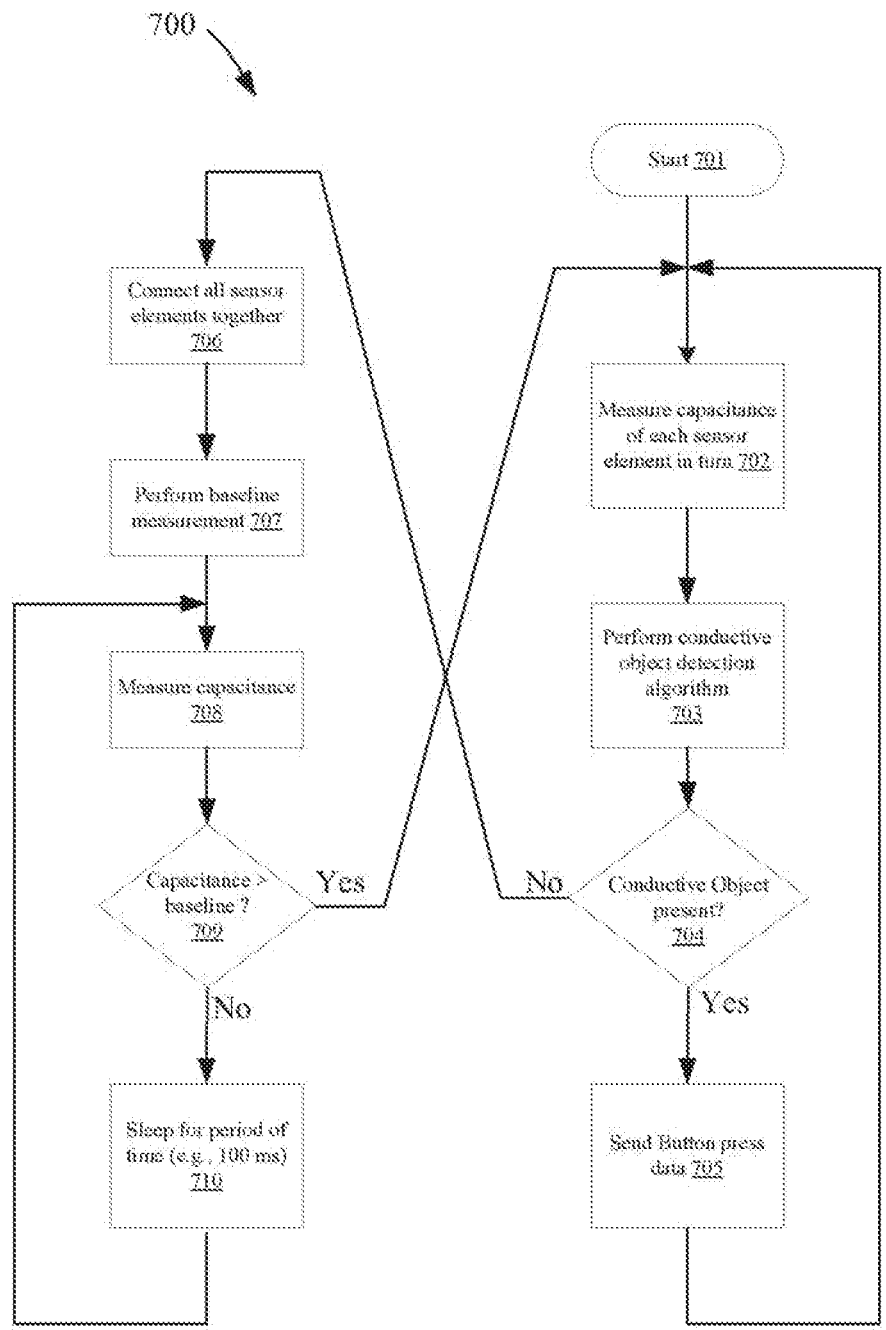
FIG. 7 illustrates a flow chart of one embodiment of a method for coupling a group of sensor elements together when in a reduced power mode.

FIG. 7 illustrates a flow chart of one embodiment of a method 700 for coupling a group of sensor elements together when in a reduced power mode. Method 700 starts in operation 701, and starts to measure a capacitance on each of the sensor elements in turn, operation 702. The processing device 210 then performs conductive object detection algorithms, operation 703. The detection algorithms may include whether a presence of the conductive object is present on the device, which sensor element, and corresponding button, has been activated, which the location of the presence of the conductive object on the device, whether a gesture is recognized, or the like. The method 700 then determines whether a conductive object detection algorithm detected the presence of the conductive object, operation 704. If the presence of the conductive object is detected in operation 704, the processing device 210 sends button press data to the host 250, and returns to measure a capacitance of each sensor element in turn in operation 702. However, if the presence of the conductive object is not detected in operation 704, the processing device 210 connects all (or a fraction of all) of the sensor elements together, operation 706. This may be done using the selection circuit 420. After all (or a fraction of all) of the sensor elements are coupled together, a baseline measurement is performed, operation 707. The baseline measurement is representative of the aggregate capacitance on the coupled sensor elements when no conductive object is present on the device. The baseline measurement accounts for the parasitic capacitance of the coupled sensor elements. Once the baseline measurement has been performed in operation 707, the capacitance is collectively measured on the coupled sensor elements, operation 708. The method 700 then determines if the collective capacitance is greater than the baseline measurement performed in operation 707, operation 709. In another embodiment, a threshold above the baseline measurement may be used. If the collective capacitance is greater than the baseline measurement or the threshold above the baseline measurement, the method returns to measuring a capacitance of each of the sensor elements in turn of operation 702. However, if the collective capacitance is not greater than the baseline measurement or the threshold above the baseline measurement, the method 700 places the device in the reduced power mode (e.g., "sleep" mode) for a period of time (e.g., 100 ms), operation 710. After the period of time has lapsed, the device wakes and measures the collective capacitance again in operation 708. This process is repeated until a presence of a conductive object is detecting using the group of sensor elements. Once the conductive object is detected, then the method returns to individually measuring each of the sensor elements.

In one embodiment, the method includes individually measuring a capacitance on each of the sensor elements of a touch-sensor device in a first mode, and collectively measuring the capacitance on the group of sensor elements in a second mode. The second mode may be a lower power mode than the first mode. The second mode includes a reduced power mode that allows the power in the device to be reduced as compared to when the device is in the first mode.

In another embodiment, the method includes individually measuring a capacitance on each of the sensor elements of a touch-sensor device. The method also includes coupling together a group of sensor elements, such as all of or a fraction of all of the sensor elements of the device when a presence of a conductive object is not detected on the sensor elements while individually measuring a capacitance on each of the sensor elements. Once the group of sensor elements is coupled together, the method includes collectively measuring a capacitance on the group of sensor elements. This may be done to reduce the amount of power consumption to determine if a conductive object is present or not on the device. If the device continues to determine that no conductive object is present on the device when the sensor elements are coupled together, the device can be placed in a reduced power mode for a period of time, periodically waking to make a coarse measurement of whether a conductive object is present or not. This reduces the power consumption of the device.

In another embodiment, the method includes transitioning from the first mode to the second mode when the presence of the conductive object is not detected on the sensor elements while individually measuring the capacitance on each of the sensor elements in the first mode. The method may also include transitioning from the second mode to the first mode when the presence of the conductive object is detected on the group of sensor elements while collectively measuring the capacitance on the group of sensor elements in the second mode. In another embodiment, the method includes transitioning to the second mode from the first mode when a presence of a conductive object is not detected after a period of time in the first mode.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitance sensing device comprising:
a first capacitance sensing electrode;
a second capacitance sensing electrode;
a capacitance measurement circuit coupled to the first capacitance sensing electrode and the second capacitance sensing electrode through a selection circuit, the capacitance measurement circuit for converting a first capacitance on the first capacitance sensing electrode to a first digital value and for converting a second capacitance on the second capacitance sensing electrode to a second digital value in a first mode and for converting the first capacitance on the first capacitance sensing electrode and the second capacitance on the second capacitance sensing electrode to a third digital value in a second mode, the third digital value representative of a combined capacitance of the first and second capacitance sensing electrodes; and
a processor coupled to the capacitance measurement circuit and for:
determining an activation state for the first and second capacitance sensing electrodes by a conductive object in the first mode,
providing control signals to the selection circuit for operation of the capacitance measurement circuit in the second mode,
performing a baseline measurement operation for the combined capacitance of the first and second capacitance sensing electrodes when the first and second capacitance sensing electrodes are not activated by the conductive object,
determining an activation state for the first and second capacitance sensing electrodes by a conductive object in the second mode, and
placing the capacitance sensing device into a reduced power mode if the first and second sensing electrodes are not activated by the conductive object in either the first mode or the second mode.

2. The capacitance sensing device of claim 1, wherein, when the capacitance sensing device is in the reduced power mode the capacitance measurement circuit and the processor are for,
periodically converting the first capacitance on the first capacitance sensing electrode and the second capacitance on the second capacitance sensing electrode to the third digital value in the second mode and determining an activation state for the first and second capacitance sensing electrodes by a conductive object, and
if the first and second sensing electrodes are not activated by the conductive object, maintaining the capacitance sensing device in the reduced power mode.

3. The capacitance sensing device of claim 2, wherein, if the first and second sensing electrodes are activated by the conductive object, the processor to maintain an active power mode for the capacitance sensing device.

4. The capacitance sensing device of claim 1, wherein determining an activation state for the first and second capacitance sensing electrodes by a conductive object in the first mode and the second mode comprises detecting a proximity of the conductive object to the first and second capacitance sensing electrodes.

5. The capacitance sensing device of claim 1, wherein the baseline measurement of the combined capacitance is representative of the combined capacitance of the first and second capacitance sensing electrodes when no conductive object is in proximity to either the first or second capacitance sensing electrodes.

6. The capacitance sensing device of claim 1, wherein the baseline measurement operation for the combined capacitance includes the third digital value.

7. The capacitance sensing device of claim 1, wherein the selection circuit is for coupling the first and second capacitance sensing electrodes together to form a group of capacitance sensing electrodes.

8. The capacitance sensing device of claim 7, wherein the group of capacitance sensing electrodes is coupled to the capacitance measurement circuit in the second mode and the combined capacitance is converted to the third value in the second mode.

9. The capacitance sensing device of claim 1, further comprising:
a third capacitance sensing electrode; and
a fourth capacitance sensing electrode,
wherein the third capacitance sensing electrode is coupled to the fourth capacitance sensing electrode by the selection circuit in the second mode and wherein a fourth digital value by the capacitance measurement circuit is representative of a combined capacitance of the first and second capacitance sensing electrodes.

10. The capacitance sensing device of claim 9, wherein the first, second, third, and fourth capacitance sensing electrodes are selectively coupled together through the selection circuit.

11. The capacitance sensing device of claim 9, wherein the third digital value representative of a combined capacitance of the first and second capacitance sensing electrodes is calculated at a first time and the fourth digital value representative of a combined capacitance of the third and fourth capacitance sensing electrodes is calculated at a second time.

12. The capacitance sensing device of claim 1, wherein the selection circuit comprises a plurality of switches, the closing of which couples the first and second capacitance sensing electrodes to the capacitance measurement circuit.

13. The capacitance sensing device of claim 1, wherein the selection circuit comprises a bus to which the first and second capacitance sensing electrodes and the capacitance measurement circuit are selectively coupled.

14. The capacitance sensing device of claim 13, wherein the bus is for receiving control signals from the processor, the control signals for coupling the first and second capacitance sensing electrodes to the bus in the first and second modes.

15. A capacitance measurement circuit coupled to a first capacitance sensing electrode and a second capacitance sensing electrode through a selection circuit, the capacitance measurement circuit for converting a first capacitance on the first capacitance sensing electrode to a first digital value and for converting a second capacitance on the second capacitance sensing electrode to a second digital value in a first mode and for converting the first capacitance on the first capacitance sensing electrode and the second capacitance on the second capacitance sensing electrode to a third digital value in a second mode, the third digital value representative of a combined capacitance of the first and second capacitance sensing electrodes, wherein the third digital value, if less than a threshold causes a controller coupled to the capacitance measurement circuit to enter a low power state.

16. The capacitance measurement circuit of claim 15, wherein the first mode corresponds to an active power state and the second mode corresponds to the low power state.

17. The capacitance measurement circuit of claim 15, wherein the second mode is entered when the first and second digital values are less than an activation threshold for the first and second capacitance sensing electrodes.

18. The capacitance measurement circuit of claim 17, wherein the first mode is entered when the third values are greater than an activation threshold for the combined first and second capacitance sensing electrodes.

* * * * *